US012563723B2

(12) United States Patent
Yu et al.

(10) Patent No.: US 12,563,723 B2
(45) Date of Patent: Feb. 24, 2026

(54) EFUSE CELLS WITH BACKSIDE POWER RAILS

(71) Applicant: Taiwan Semiconductor Manufacturing Company Ltd., Hsinchu (TW)

(72) Inventors: Li-Chin Yu, Hsinchu (TW); Meng-Sheng Chang, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 120 days.

(21) Appl. No.: 18/410,190

(22) Filed: Jan. 11, 2024

(65) Prior Publication Data

US 2025/0071984 A1 Feb. 27, 2025

Related U.S. Application Data

(60) Provisional application No. 63/520,840, filed on Aug. 21, 2023.

(51) Int. Cl.
H10B 20/00 (2023.01)
G11C 17/16 (2006.01)
(Continued)

(52) U.S. Cl.
CPC ............. H10B 20/25 (2023.02); G11C 17/16 (2013.01); G11C 17/18 (2013.01); H01L 23/5256 (2013.01); H01L 23/5286 (2013.01)

(58) Field of Classification Search
CPC . H01L 23/481; H01L 23/5286; H01L 23/485; H01L 23/50; H01L 23/5228; H01L 23/5384; H01L 23/5385; H01L 23/5386; H01L 23/5256; H01L 2924/00; H01L 2924/0002; H01L 23/528; H01L 23/573; (Continued)

(56) References Cited

U.S. PATENT DOCUMENTS 12,021,033 B2 * 6/2024 Chen .................... H01L 23/5286

FOREIGN PATENT DOCUMENTS

TW 202329426 A 7/2023

OTHER PUBLICATIONS

Office Action issued in connection with Taiwan Appl. No. 113116296 dated Feb. 19, 2025.

* cited by examiner

*Primary Examiner* — Thong Q Le
(74) *Attorney, Agent, or Firm* — Foley & Lardner LLP

(57) ABSTRACT

A memory device includes a memory cell having a transistor and a resistor coupled to each other, where the memory cell is on the first side, and the transistor further includes a plurality of first sub-transistors disposed in a first region of the substate. The memory device includes a plurality of second sub-transistors disposed in a second region of the substrate. The memory device further includes a first interconnect structure disposed on the second side. The first sub-transistors are each coupled to the first interconnect structure through a plurality of first via structures. The second sub-transistors are each coupled to the first interconnect structure through a plurality of second via structures and at least a third via structure, where the first via structures and the second via structures each have a first cross-sectional area, and the third via structure has a second cross-sectional area that is different from the first cross-sectional area.

20 Claims, 25 Drawing Sheets

(51) Int. Cl.
*G11C 17/18* (2006.01)
*H01L 23/525* (2006.01)
*H01L 23/528* (2006.01)
*H10B 20/25* (2023.01)

(58) Field of Classification Search
CPC ..... H01L 2924/14; G11C 17/16; G11C 17/18;
G11C 17/165; H10D 84/811; H10D
62/121; H10D 84/0149; H10D 84/038;
H10D 84/83; H10D 89/10; H10D
30/0297; H10D 30/0316; H10D 30/0321;
H10D 30/665; H10D 30/668; H10D
30/669; H10D 30/6729; H10D 30/6735;
H10D 62/105; H10D 62/112; H10D
62/114; H10D 62/126; H10D 62/127;
H10D 8/25; H10D 8/411; H10D 84/141;
H10D 84/143; H10D 84/148; H10D
86/00; H10D 86/0229; H10D 86/0241;
H10D 86/423; H10D 86/60; H10D 89/00;
H10D 89/611; H10D 1/47; H10D 84/901;
H10B 20/25; H10B 20/60
See application file for complete search history.

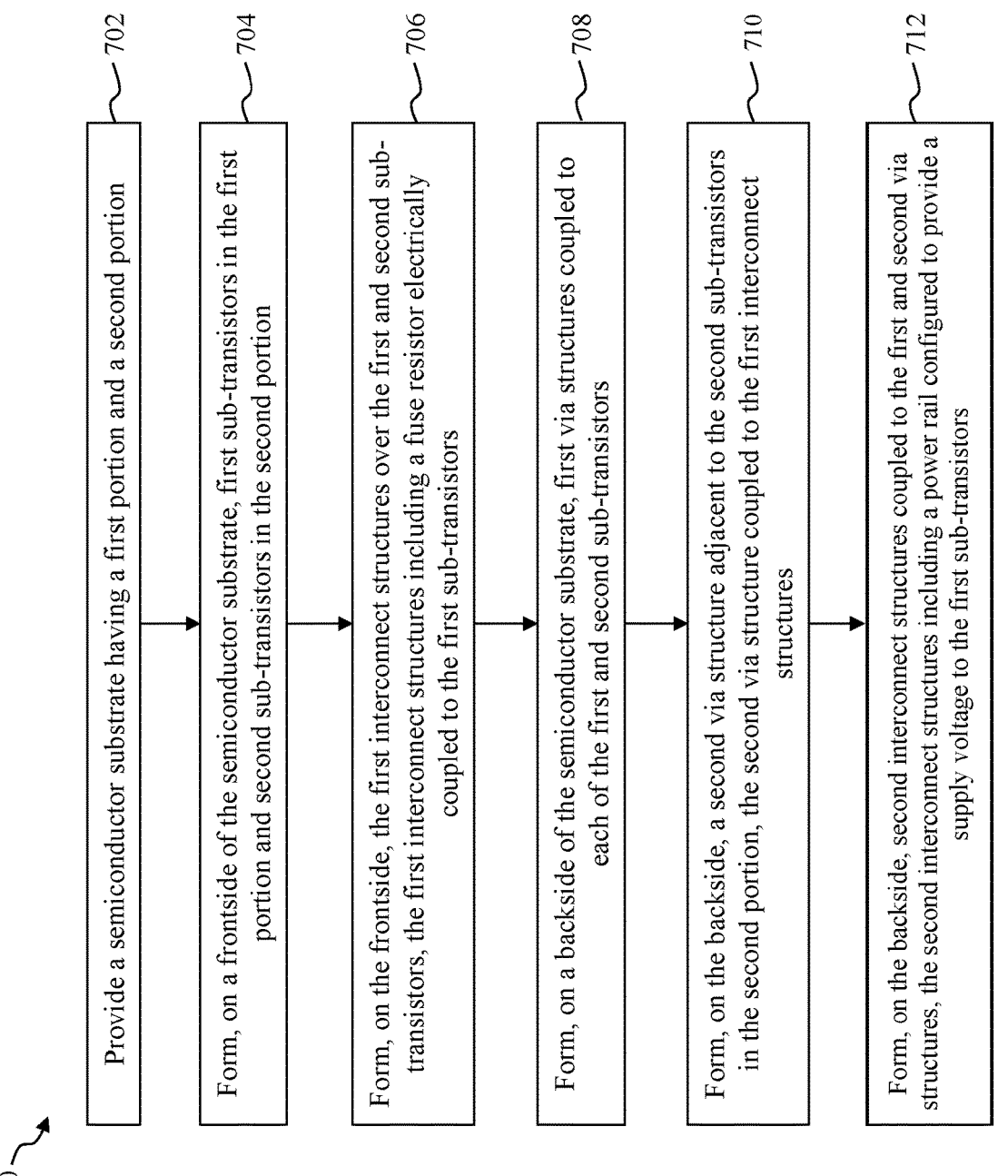

702 — Provide a semiconductor substrate having a first portion and a second portion 704 — Form, on a frontside of the semiconductor substrate, first sub-transistors in the first portion and second sub-transistors in the second portion 706 — Form, on the frontside, the first interconnect structures over the first and second sub-transistors, the first interconnect structures including a fuse resistor electrically coupled to the first sub-transistors 708 — Form, on a backside of the semiconductor substrate, first via structures coupled to each of the first and second sub-transistors 710 — Form, on the backside, a second via structure adjacent to the second sub-transistors in the second portion, the second via structure coupled to the first interconnect structures 712 — Form, on the backside, second interconnect structures coupled to the first and second via structures, the second interconnect structures including a power rail configured to provide a supply voltage to the first sub-transistors

EFUSE CELLS WITH BACKSIDE POWER RAILS

CROSS-REFERENCE TO RELATED APPLICATION

This application claims priority to and the benefit of U.S. Provisional Application No. 63/520,840, filed Aug. 21, 2023, titled "EFUSE CELLS WITH BACKSIDE POWER RAILS," which is incorporated herein by reference in its entirety for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

Electrical fuses (eFuses) are devices used to reprogram integrated circuit (IC) chips, such as computer chips. In some instances, eFuses can be used to provide in-chip performance tuning. If a component of the IC chip fails, for example, an eFuse can be blown to change behavior or to switch in a back-up system. An IC chip may be provided with an array of eFuse cells each having a one-transistor-one-resistor, or 1T1R, architecture. For example, each eFuse cell may include one MOS (e.g., an n-type MOS or NMOS) transistor (1T) operatively coupled to one fuse element, or resistor, (1R). An eFuse may be generally implemented by a weak trace coupled in a current path to a power source such that when a sufficiently high level of voltage (power) or current is provided to the eFuse, the eFuse would fail before other circuits (or other circuit components) do, thereby tuning the behavior of the IC chip. While existing eFuse devices have generally been adequate, they are not entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 28 illustrates a flow chart of an example method for making one or more memory cells on a frontside of a substrate that are coupled with interconnect structures on a backside of the substrate, in accordance with some embodiments.

DETAILED DESCRIPTION

Figure 1:
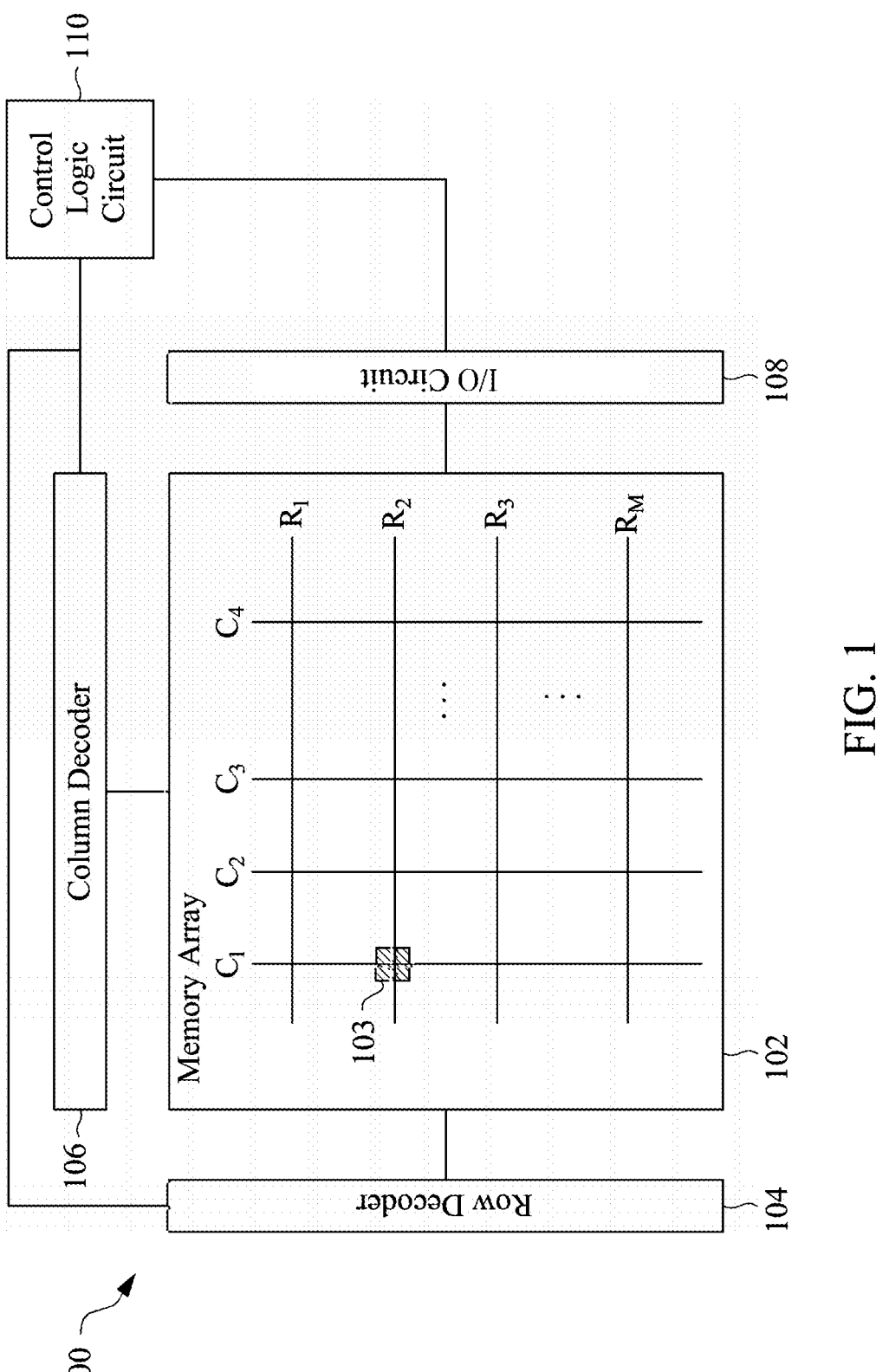
FIG. 1 illustrates a block diagram of an example semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device is one type of the non-volatile memory device utilized in integrated circuits for adjusting the circuitry after fabrication of an integrated circuit. For example, the OTP memory device is used for providing repair information that controls the usage of redundant cells in replacing defective cells of a memory array. Another use is for tuning analog circuitry by trimming a capacitive or resistive value of an analog circuit or enabling and disabling portions of the system. A recent trend is that the same product is likely to be manufactured in different fabrication facilities though in a common process technology. Despite best engineering efforts, it is likely that each facility will have a slightly different process. Usage of OTP memory devices allows independent optimization of the product functionality for each manufacturing facility.

As IC technology advances, feature sizes (e.g., the width of interconnect structures) have been decreasing, allowing for more circuitry to be implemented in an IC. There are challenges associated with implementing OTP memory devices such as, for example, eFuses, in an IC. In applications where components of an eFuse (or an eFuse cell, an eFuse memory cell) are formed over a frontside of an IC chip and power (or voltage) is provided to the fuse element of the eFuse from a backside of the IC chip (substrate), higher resistance may be exhibited by one or more vias configured to transmit the power from the backside to the frontside of the chip due to the vias' small diameters (i.e., cross-sectional areas). Such increase in resistance makes it difficult for the current in the vias to rise to a sufficiently high level and cause the fuse element to fail. As a result, it can become challenging to program the IC components coupled to the eFuse. Thus, the existing eFuses in OTP memory devices have not been entirely satisfactory.

The present disclosure provides various embodiments of a semiconductor device including an eFuse coupled to backside power rails (or backside interconnect structures) through a number of via structures disposed in a device region and/or an adjacent tap region to reduce resistance and power dissipation along a conduction path of the eFuse. The terms "couple" and "connect," as used herein, refer to electrical or otherwise operative connection between two components with or without any intervening layers or components formed therebetween. As such, unless stated explicitly, the terms "coupled," "connected," "electrically coupled," and "operatively coupled" are used interchangeably in the present disclosure.

FIG. 1 illustrates an example block diagram of a semiconductor (e.g., memory) device 100, in accordance with various embodiments. In the illustrated embodiment of FIG. 1, the semiconductor device 100 includes a memory array 102, a row decoder 104, a column decoder 106, an input/output (I/O) circuit 108, and a control logic circuit 110. Despite not being explicitly shown in FIG. 1, the components of the semiconductor device 100 may be operatively coupled to each other and to the control logic circuit 110. For example, the control logic circuit 110, the I/O circuit 108, the column decoder 106, and the row decoder 104 may be electrically coupled to the memory array 102. Although, in the illustrated example of FIG. 1, the components are shown as separate blocks for the purpose of clear illustration, in some other embodiments, some or all of the components may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., X-direction) and a number of columns $C_1, C_2, C_3 \ldots C_N$, each extending in a second direction (e.g., Y-direction). Each of the rows/columns may include one or more conductive structures. In some embodiments, each memory cell 103 is arranged in the intersection of a corresponding row and a corresponding column and can be operated according to voltages or currents through the respective conductive structures of the column and row.

In accordance with various embodiments of the present disclosure, each memory cell 103 is implemented as OTP memory cell, such as an eFuse cell (hereafter referred to as eFuse cell 103 or eFuse memory cell 103) that includes a fuse resistor and an access transistor coupled to each other in series. The access transistor can be coupled to (e.g., gated by) a word line (WL). The access transistor can be turned on/off to enable/disable an access (e.g., program, read) to the corresponding fuse resistor. For example, upon being selected, the access transistor of the selected fuse cell is turned on to generate a program or read path conducting through its fuse resistor and itself.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the eFuse cells 103 asserted through the row decoder 104 and column decoder 106. The control logic circuit 110 is a hardware component that can control the coupled components (e.g., 102 through 108).

Figure 2:
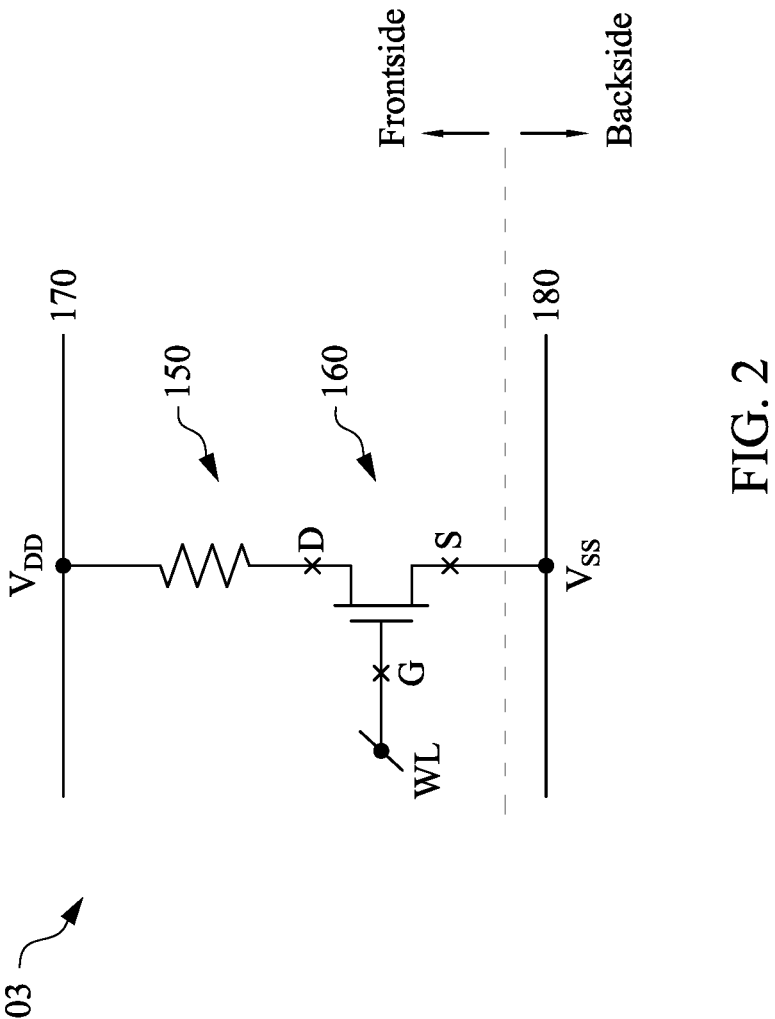
FIG. 2 illustrates an example circuit diagram of an example memory cell of the semiconductor device of FIG. 1, in accordance with some embodiments.

FIG. 2 illustrates an example configuration of an eFuse memory cell (e.g., 103 of FIG. 1), in accordance with some embodiments. In the example of FIG. 2, the eFuse memory cell 103 is implemented as a one-transistor-1-resistor (1T1R) configuration, for example, a fuse resistor 150 and an access transistor 160 connected to each other in series. It, however, should be understood that any of various other fuse configurations that exhibit the fuse characteristic may be used by the eFuse memory cell 103 such as, for example, a 2-diodes-1-resistor (2D1R) configuration, a many-transistors-one-resistor (manyT1R) configuration, etc., while remaining within the scope of the present disclosure.

In accordance with various embodiments of the present disclosure, the fuse resistor 150 and the access transistor 160 are formed on the same side, e.g., the frontside of a semiconductor substrate (or substrate), while supply voltage $(V_{SS})$ at the SL 180 of the eFuse cell 103 is provided from power rails disposed on an opposite side, i.e., the backside, of the substrate through various types of via structures. Such backside power rails, which include backside metallization layers, may alternatively be referred to as backside interconnect structures throughout the present disclosure.

In an example embodiment, the access transistor 160 is formed on the frontside of a substrate, which is sometimes referred to as part of a front-end-of-line (FEOL) processing, and a number of metallization layers, each of which includes a number of metal structures (e.g., metal lines), are formed over the FEOL processing on the frontside as a part of frontside interconnect structures of a back-end-of-line (BEOL) processing. The fuse resistor 150 may be formed of one or more of the metal structures in one of the metallization layers (e.g., $M_2$ metallization layer) that are disposed above the access transistor 160 as a part of frontside interconnect structures. Accordingly, the access transistor 160 and the fuse resistor 150 may be formed through the FEOL processing and BEOL processing (on the frontside), respectively. In some embodiments, the fuse resistor 150 includes other types of conductive material, such as polysilicon. In some embodiments, the fuse resistor 150 includes a conductive material with higher resistance than the conductive material in other metal structures of the BEOL processing, allowing the fuse resistor 150 to be blown more easily. For purposes of clarity, metal structure(s) configured as the fuse resistor 150 and the metal structure(s) configured as the backside power rails are herein referred to as frontside metal structure(s) and backside metal structure(s), respectively.

With the fuse resistor 150 of the eFuse memory cell 103 embodied as a (frontside) metal structure, the fuse resistor 150 may present an initial resistance value (or resistivity), for example, as fabricated. To program the eFuse memory cell 103, the access transistor 160 (e.g., embodied as an n-type transistor) is turned on by applying a (e.g., voltage) signal, corresponding to a logic high state, through a word line (WL) to a gate terminal of the access transistor 160. Concurrently or subsequently, with the access transistor 160 turned on, a high enough (e.g., voltage/current) signal, such as a programming voltage, is applied on one of the terminals of the fuse resistor 150 through a bit line (BL) 170 and a supply voltage is applied on a source line (SL) 180, thereby establishing a first conduction (e.g., programing) path. In the present embodiments, the supply voltage is applied from the backside of the substrate (e.g., in the backside interconnect structures). In this regard, the first conduction (e.g., programming) path extends from the BL 170, through a first end of the fuse resistor 150, the fuse resistor 150, a second end of the fuse resistor, the access transistor 160, a plurality of via structures, such as backside vias and/or feedthrough vias, and to the SL 180 disposed on the backside of the substrate, according to some embodiments. This configuration differs from existing conventional eFuse memory cell designs in which the supply voltage $V_{SS}$ is typically applied from the frontside, such as through the frontside interconnect structures. In this regard, the eFuse memory cell 103 of the present disclosure at least benefits from additional routing options from the backside of the substrate, thereby improving flexibility in cell design and/or ease of manufacturing associated with the fabrication process.

In some embodiments, additional via structures are incorporated along the conduction path between the access transistor 160 and the backside power rails (i.e., the backside interconnect structures) to reduce the resistance of the conduction path and improve device performance in the eFuse memory cell 103. For example, the present disclosure provides eFuse memory cells (e.g., the eFuse memory cell 103) that each include a device region adjacent to a tap (e.g., pick-up, dummy, guard ring, etc.) region, where the device region includes a plurality of sub-transistors each functioning as an access transistor (e.g., the access transistor 160) and the tap region includes a plurality of dummy sub-transistors. Each of the functional sub-transistors has a first source/drain terminal coupled to a fuse resistor (e.g., the fuse resistor 150) disposed in a frontside metallization layer (in the frontside interconnect structures) and a second source/drain terminal coupled to a supply voltage source (e.g., the SL 180) disposed in a backside metallization layer (in the backside interconnect structures) through at least one of the via structures described above. Each of the dummy sub-transistors has its source terminal, drain terminal, and gate terminal coupled to the supply voltage source disposed in the backside metallization layer through at least one of the via structures. In this regard, the resistance of the conduction path between the access transistor and the supply voltage source can be tuned (e.g., reduced) for a given applied supply voltage.

In some embodiments, the placement of the via structures used for connecting the functional sub-transistors and the dummy sub-transistors is determined based on, for example, a size of each via structure with respect to a size of a cell area available for placement of the via structure. For example, the backside via, being coupled to and overlapping a source/drain terminal of the access transistor has a smaller cross-sectional area compared to a feedthrough via, which typically has an elongated shape in a top view extending parallel to an active region (e.g., a fin) of the eFuse memory cell. Since resistance generally varies inversely with the cross-sectional area of a conductor, the resistance of the backside via is higher than that of the feedthrough via. In some examples, the resistance of a feedthrough via can be as low as ⅛ of the resistance of a backside via. Accordingly, for the device region where cell area is more limited in comparison to the tap region, more area-efficient backside vias may be utilized and more feedthrough vias may be utilized in the tap region. In some embodiments, both backside vias and feedthrough vias are utilized in both the device region and the tap region.

Figure 3:
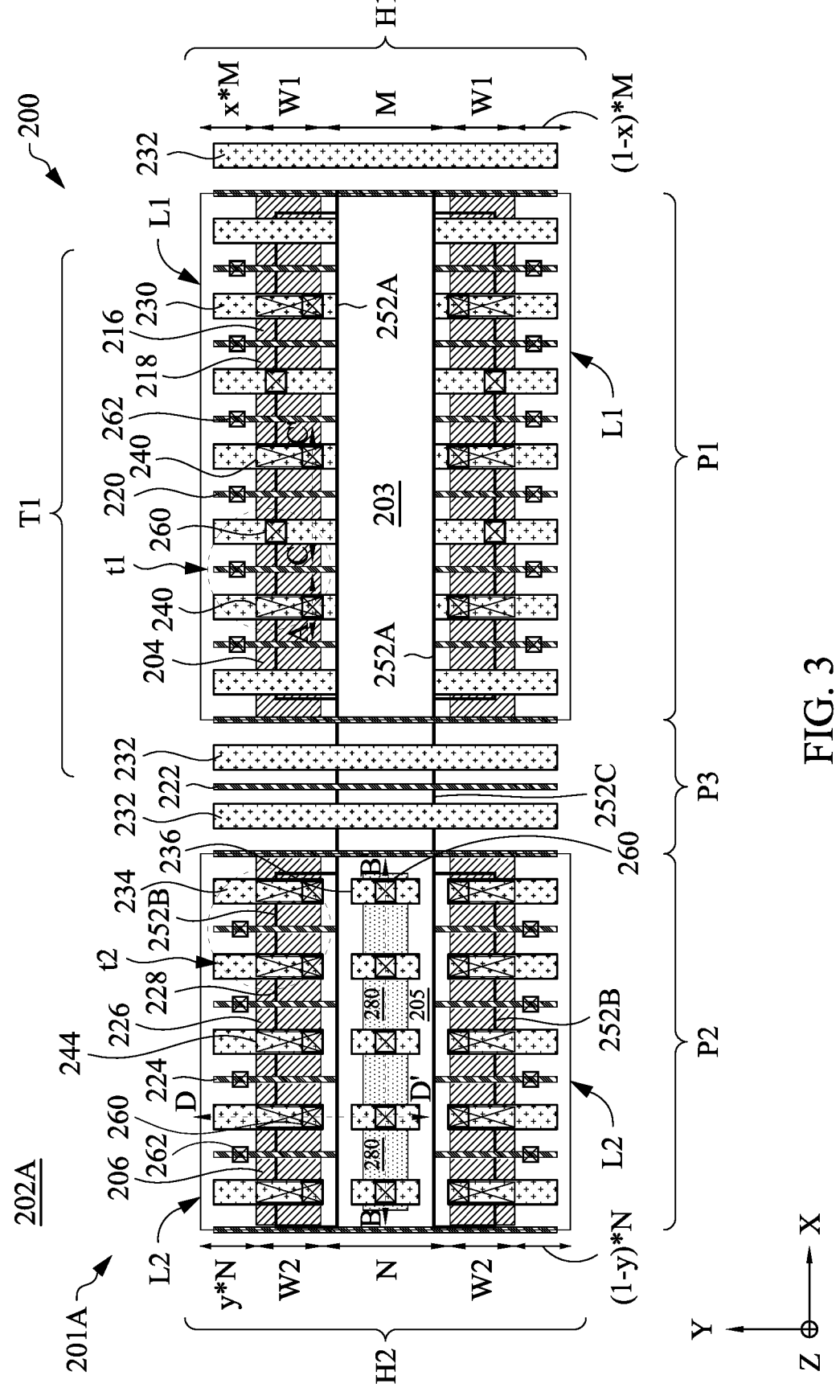
FIGS. 3, 8, 12, 16, 19, 22, and 23 each illustrate a frontside layout design of an example memory cell coupled to backside interconnect structures (e.g., power rails), in accordance with some embodiments.

FIG. 3 illustrates a frontside layout design of a portion of an example semiconductor device 200. The semiconductor device 200 includes a plurality of eFuse memory cells 201A (e.g., the eFuse memory cell 103) disposed over a frontside 202A of a semiconductor substrate (or substrate) 202 (see FIG. 4, for example). An embodiment of the eFuse memory cell 201A is depicted in FIG. 3. In some embodiments, the substrate 202 includes a plurality of doped wells, such as p-type wells and n-type wells for providing n-type devices (e.g., NMOS devices) and p-type devices (e.g., PMOS devices), respectively. It is noted that multiple dielectric components (e.g., FEOL isolation regions of the eFuse memory cell 201A) have been removed from FIG. 3 and the subsequent figures to lend greater clarity to the description of various components of the eFuse memory cell 201A.

In the present embodiments, the substrate 202 includes a first region (e.g., area, portion, etc.) P1, a second region P2, and a third region P3 interposed between the first region P1 and the second region P2 along a first lateral direction (e.g., the X axis). In some embodiments, the first region P1 is configured as a device region for providing active components of the eFuse memory cells 201A and the second region P2 is configured as a tap region adjacent to or surrounding the first region P1 for separating the first regions P1 of adjacent eFuse memory cells 201A in a given layout of the semiconductor device 200, among other functions. The third region P3 may be configured as a dummy region (e.g., without any devices) and may include at least one dummy gate structure 222 and at least one source/drain contact 232 each extending lengthwise along a second lateral direction (e.g., the Y axis) and interposed between vertical boundaries of the first region P1 and the second region P2 along the first lateral direction. In some embodiments, as depicted herein, the second region P2 extends adjacent to the first region P1 along the second lateral direction.

The first region P1 has a first cell height H1 and the second region P2 has a second cell height H2, each of which is defined along the second lateral direction. In some embodiments, the cell heights H1 and H2 are the same. In some embodiments, the cell height H1 is greater than the cell height H2. In some embodiments, the cell height H2 is greater than the cell height H1. In some examples, the cell heights H1 and H2 are each at least about 156 nm. In the depicted embodiment of FIG. 3, the cell heights H1 and H2 are both about 208 nm.

In the first region P1, the eFuse memory cell 201A includes a plurality of active regions (also each referred to as an oxide diffusion, or OD, regions) 204 over the frontside 202A of the substrate 202 and separated by isolation regions (not depicted separately). The active regions 204 each extend lengthwise along the first lateral direction and are separated from one another along the second lateral direction. The active regions 204 may each include a monolithic structure, such as a fin active region, for providing fin-like field-effect transistors (FinFETs). Alternatively, the active regions 204 may each include a stack of nanostructures (e.g., nanosheets, nanorods, etc.) for providing gate-all-around (GAA) FETs. Other configurations of the active regions 204 may also be applicable to the eFuse memory cell 201A, according to some embodiments of the present disclosure. The active regions 204 each have a height W1 defined along the second lateral direction as depicted in FIG. 3, and adjacent active regions 204 are separated by a distance M, which is also referred to as a height of a dummy region 203 of the substrate 202.

The eFuse memory cell 201A includes a plurality of gate structures (e.g., functional gate structures) 220 oriented perpendicular to and over portions of the active regions 204 to define channel regions therein, where each channel region is interposed between a pair of source/drain regions (e.g., source/drain terminals) 216/218 along the first lateral direction. In this regard, the gate structure 220 engages with each pair of the source/drain regions 216/218 to form a sub-transistor t1, where the sub-transistor t1 is a functional transistor. In some embodiments, the gate structures 220 spaced along the second lateral direction are separated by the dummy region 203. The eFuse memory cell 201A further includes a plurality of source/drain contacts 230 extending lengthwise along the second lateral direction and separated from one another along the first lateral direction, each being interposed between adjacent gate structures 220. Each of the source/drain contacts 230 is electrically coupled to each of the source/drain regions 216/218 of the sub-transistor t1. In the depicted embodiments, each source/drain contact 230 protrudes from one of the long edges of the active regions 204 towards a horizontal boundary L1 of the first region P1 along the second lateral direction.

Each of the sub-transistors t1 (e.g., a FinFET, a GAA FET, etc.) functions as an access transistor, which is an implementation of the access transistor 160 described above. A plurality of the sub-transistors t1 are collectively referred to as a transistor T1 in the eFuse memory cell 201A. Specifically, each sub-transistor t1 has one of the source/drain terminals (i.e., one of the source/drain regions 216/218) coupled to the supply voltage source (e.g., backside interconnect structures 250) where the $V_{SS}$ is applied, and the one other of the source/drain terminals coupled to a fuse resistor (e.g., fuse resistor 356 in frontside interconnect structures 300). In some embodiments, the sub-transistors t1 are n-type devices formed in a p-type well in the substrate 202. As depicted herein, the eFuse memory cell includes four sub-transistors t1. It is noted that more or less of the sub-transistors t1 may be included in eFuse memory cell 201A, according to embodiments of the present disclosure.

Figure 6:
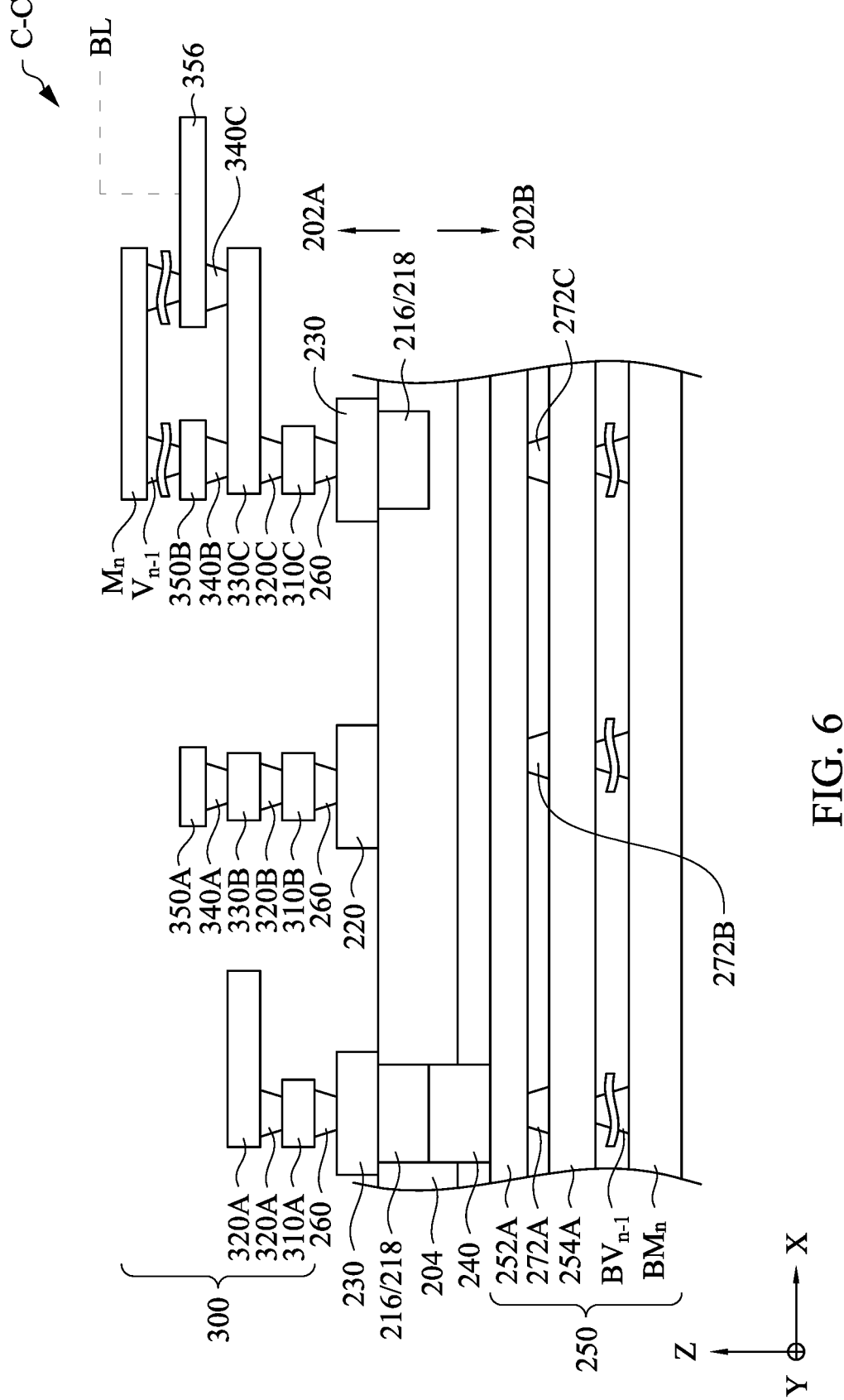
FIGS. 6, 9, 13, and 17 each illustrate a schematic cross-sectional view along line CC' of the example memory cell of FIGS. 3, 8, 12, and 16, respectively, in accordance with some embodiments.
Figure 7:
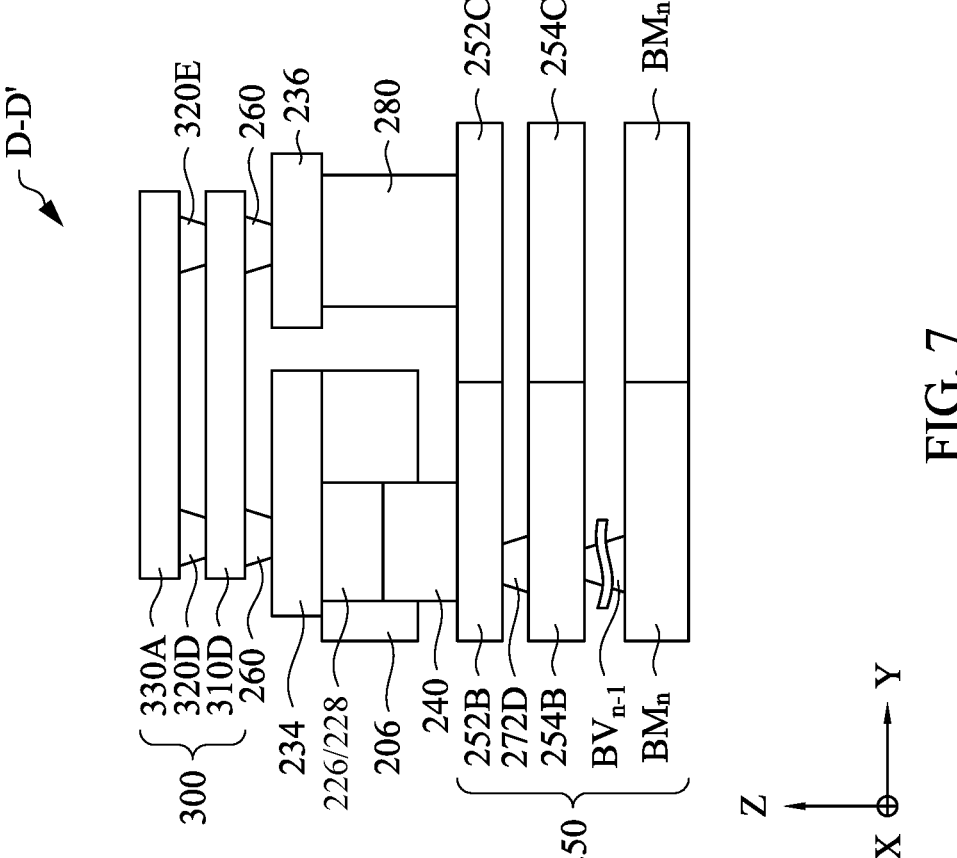
FIGS. 7, 10, 14, 18, and 20 each illustrate a schematic cross-sectional view along line DD' of the example memory cell of FIGS. 3, 8, 12, 16, and 19, respectively, in accordance with some embodiments.

The eFuse memory cell 201A further includes frontside interconnect structures 300 coupled to the source/drain contacts 230 and the gate structures 220. The frontside interconnect structures 300 include, for example, vias 260 configured to couple at least some of the source/drain contacts 230 to a frontside metallization layer 310 ($M_0$), which includes metal lines (e.g., metal tracks) 310A (FIG. 6), 310B (FIG. 6), 310C (FIG. 6), and 310D (FIG. 7), for example. The eFuse memory cell 201A further includes gate contacts 262 configured to couple at least some of the gate structures 220 to the frontside metallization layer 310. The frontside metallization layer 310 may be a first of many metallization layers (e.g., frontside metallization layers 330 and 350 as depicted in FIGS. 6 and 7) disposed over the frontside 202A of the substrate in the first region P1. Details of the frontside interconnect structures 300 are described below with respect to FIGS. 6 and 7.

In some embodiments, referring to FIG. 3, the second region P2 is a tap region that electrically couples a particular doped well (e.g., an n-type well for forming a PMOS device or a p-type well for forming an NMOS device) in the substrate 202 to a voltage source. In the depicted embodiments, since the sub-transistors t1 are n-type devices, the second region P2 is a p-type tap (or a P-tap) region configured to electrically couple the p-type well in the eFuse memory cell 201A to the supply voltage $V_{SS}$, which is provided on a backside 202B of the substrate 202. In further embodiments, a concentration of a p-type dopant in the P-tap region (i.e., the second region P2) is higher than a concentration of the p-type dopant in the p-type well in the first region P1. In some embodiments, the second region P2 is implemented in the eFuse memory cell 201A to reduce or prevent undesirable short circuits caused by latchup.

Still referring to FIG. 3, in the second region P2, the eFuse memory cell 201A includes a plurality of active regions 206 over the frontside 202A of the substrate 202. The active regions 206 are similar to the active regions 204. For example, the active regions 206 each extend lengthwise along the first lateral direction and are separated from one another along the second lateral direction. Two adjacent active regions 206 are separated by a dummy region 205 in the substrate 202, similar to the dummy region 203 between two adjacent active regions 204.

The active regions 206 each have a height W2 defined along the second lateral direction, where the height W2 may be the same as or different from the height W1. In some embodiments, the height W1 is greater than or equal to the height W2. In some embodiments, the height W1 and the height W2 are each about 32 nm, 42 nm, or 58 nm. For example, the height W1 may be about 42 nm and the height W2 may be about 32 nm. A separation distance N between the two adjacent active regions 206 that extends as a height of the dummy region 205 may be the same as or different from the distance M of the dummy region 203. In some examples, the distance (or height) M is at least about 62 nm and the distance (or height) N is at least about 72 nm. As will be discussed in detail below, the formation of a feedthrough via between two adjacent active regions 204 and/or between adjacent active regions 206 is possible when the height M and the height N, respectively, are greater than a height of the feedthrough via defined along the second lateral direction. As depicted herein, the cell height H1 is the sum of the total height of the active regions 204 (e.g., 2*W1), the height M of the dummy region 203, and a total separation distance between each of the active regions 204 and a corresponding horizontal boundary L1 of the first region P1, which can be calculated as a sum of x*M and (1−x)*M, x being a fraction between 0 and 1. In other words, the total separation distance between each of the active regions 204 and a corresponding horizontal boundary L1 equates to the height M. Similarly, the cell height H2 is the sum of the total height of the active regions 206 (e.g., 2*W2), the height N of the dummy region 205, and a total separation distance between each of the active regions 206 and each corresponding horizontal boundary L2 of the second region P2, which can be calculated as a sum of y*N and (1−y)*N, y being a fraction between 0 and 1.

Similar to the region P1, the region P2 of the semiconductor device 200 includes a plurality of gate structures 224 oriented perpendicular to and over portions of each active region 206 to define a channel region interposed between a pair of source/drain regions 226/228 along the first lateral direction. Thus, the gate structure 224 engages with each pair of the source/drain regions 226/228 to form a sub-transistor t2 (e.g., a FinFET, a GAA FET, etc.). The semiconductor device 200 further includes a plurality of source/drain contacts 234 extending along the second lateral direction and interposed between adjacent gate structures 224. Each of the source/drain contacts 234 is electrically coupled to each of the source/drain regions 226/228 of the sub-transistor t2. In the depicted embodiments, each source/drain contact 234 protrudes from one of the long edges of the active regions 206 towards the horizontal boundary L2 of the second region P2 along the second lateral direction.

In the present embodiments, the source/drain terminals (i.e., both of the source/drain regions 226/228) and the gate terminal interposed between the source/drain terminals of each sub-transistor t2 are coupled to the supply voltage source where the $V_{SS}$ is applied, rendering each sub-transistor t2 a dummy, or non-functional, transistor. This is in contrast to the sub-transistors t1, which are access transistors each having one of the source/drain regions 216/218 coupled to the fuse resistor 356 and the other one of the source/drain regions 216/218 coupled to the supply voltage source. The semiconductor device 200 in the present embodiments includes a plurality of sub-transistors t2 coupled together in parallel.

Similar to the first region P1, portions of the sub-transistors t2 in the second region P2 are coupled to the frontside interconnect structures 300. For example, the vias 260 are configured to couple each of the source/drain contacts 234 to the frontside metallization layer 310, and the gate contacts 262 are configured to couple each of the gate structures 224 to the frontside metallization layer 310.

Figure 4:
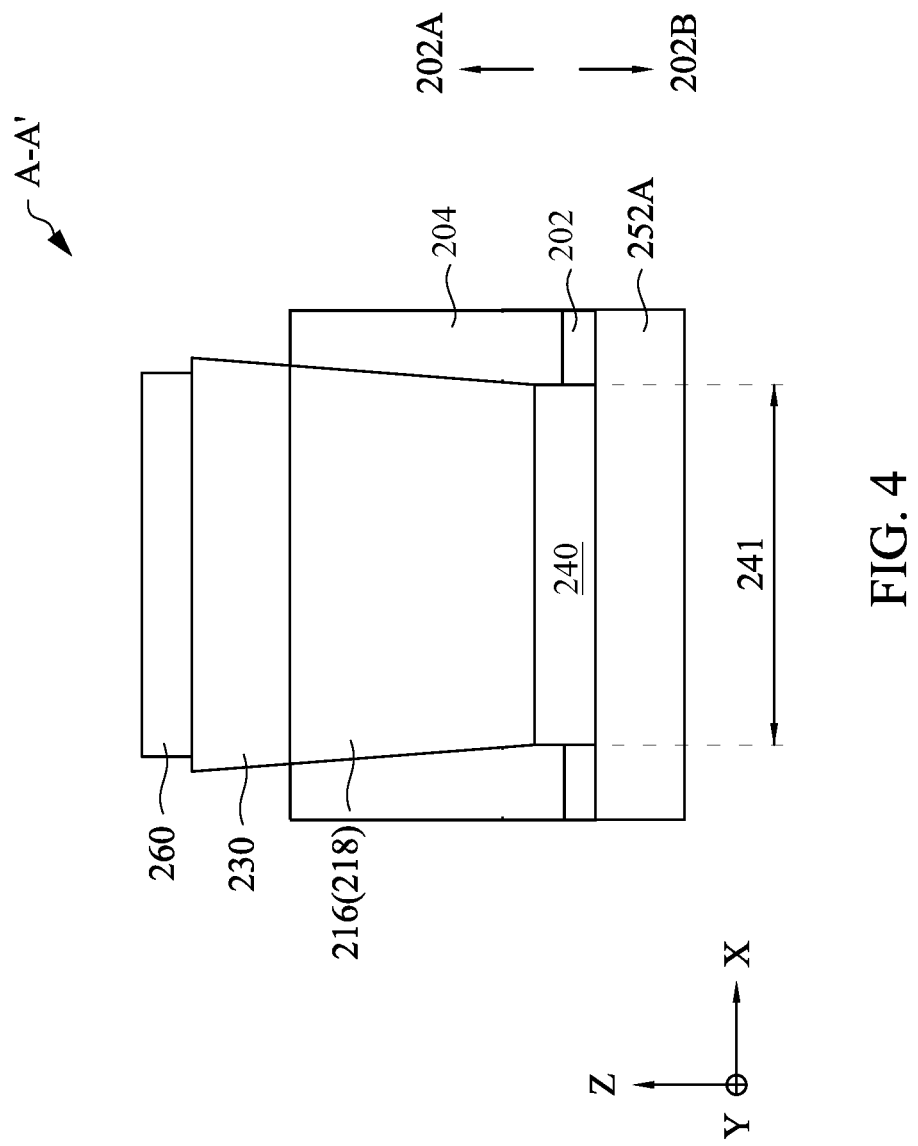
FIG. 4 illustrates a schematic cross-sectional view along line AA' of the example memory cell of FIG. 3, in accordance with some embodiments.

Referring to FIG. 4, which illustrates a cross-sectional view of the eFuse memory cell 201A along line AA' as shown in FIG. 3, the semiconductor device 200 includes a backside via 240 coupled to a portion of the eFuse memory cell 201A in the first region P1. The backside via 240 extends vertically (e.g., along the Z axis) through at least the substrate 202 and the active region 204 to couple a metal line 252A of a backside metallization layer (BM₀) 252 to one of the source/drain regions 216/218 of the sub-transistor t1 in the eFuse memory cell 201A, where the metal line 252A (also depicted in FIG. 3) is formed over a backside 202B of the substrate 202. The metal line 252A is considered a part of backside interconnect structures 250 (e.g., an implementation of the supply voltage source, or the SL, 180; see FIGS. 6 and 7) that provides power to the frontside components (e.g., the source/drain regions 216/218) of the eFuse memory cell 201A through the backside via 240. In the present embodiments, the backside via 240 directly contacts both the metal line 252A and the source/drain region 216/218 of the sub-transistor t1, which is further coupled to the fuse resistor 356 in the frontside interconnect structures 300. In this regard, the backside via 240 partially penetrates the active region 204 in the vertical direction (e.g., along the Z axis). As discussed above, the backside interconnect structures 250 are configured to provide the supply voltage $V_{SS}$ from the backside 202B to the frontside 202A of the substrate 202 to establish the conduction (e.g., programming) path for the eFuse memory cell 201A.

The backside via 240 has a width 241 defined along the first lateral direction. Though not depicted, the backside via 240 may include a metal fill layer (not depicted separately) over a barrier layer (not depicted separately). The metal fill layer may include any suitable conductive material including, for example, tungsten (W), copper (Cu), aluminum (Al), gold (Au), cobalt (Co), ruthenium (Ru), the like, or combinations thereof. In some examples, the metal fill layer may include a seed layer. The barrier layer may include Ti, Ta, TiN, TaN, the like, or combinations thereof. In some embodiments, though not depicted, the eFuse memory cell 201A further includes a first metal silicide layer disposed between the backside via 240 and the source/drain region 216/218 and a second metal silicide layer disposed between a frontside (or top surface) of the source/drain region 216/218 and the source/drain contact 230.

Figure 5:
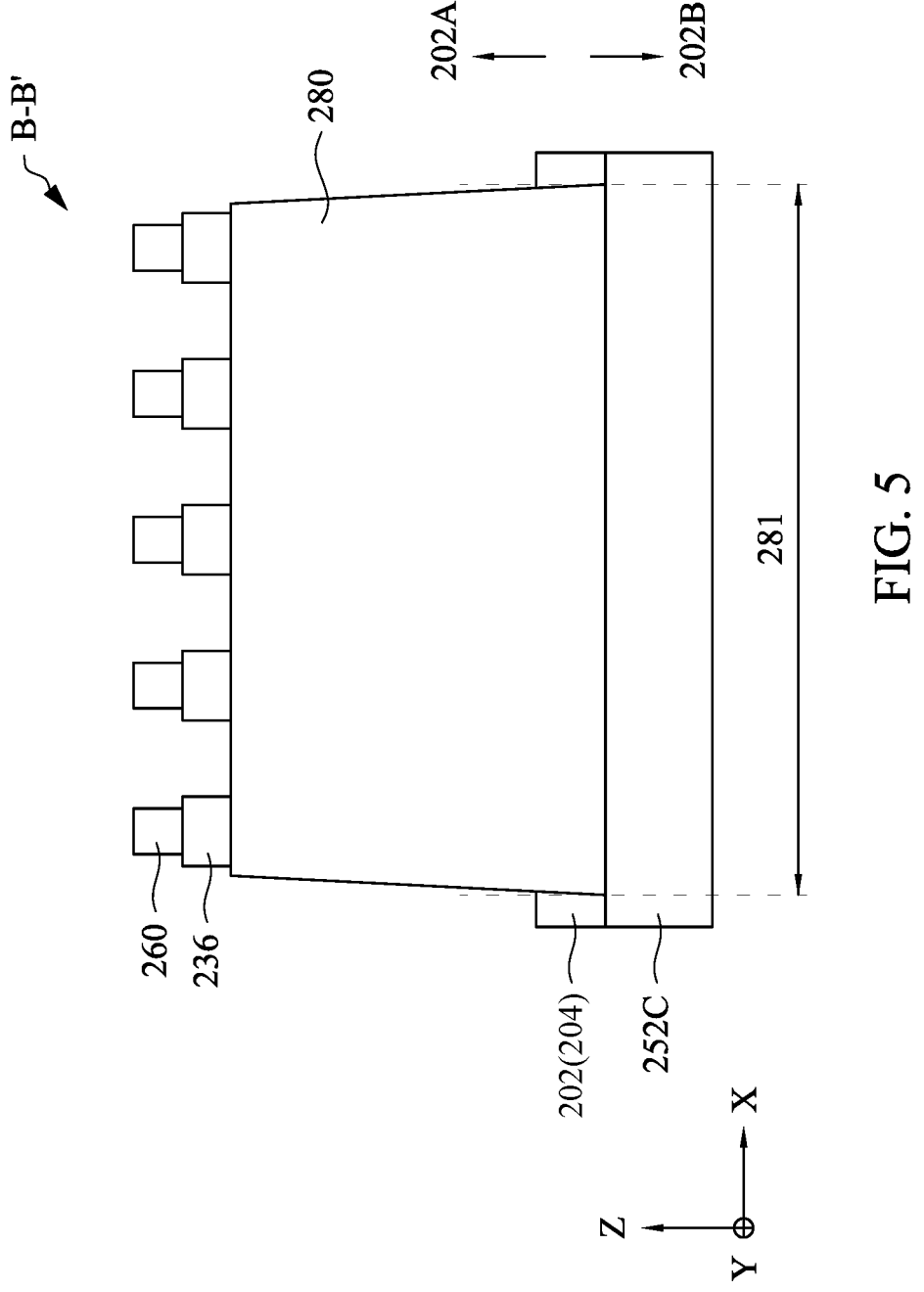
FIG. 5 illustrates a schematic cross-sectional view along line BB' of the example memory cell of FIG. 3, in accordance with some embodiments.

FIG. 5 illustrates a feedthrough via 280 in a cross-sectional view of the semiconductor device 200 along line BB' in the second region P2 of FIG. 3. As shown in the layout design of FIG. 3, the feedthrough via 280 extends lengthwise along the first lateral direction and is separated from adjacent active regions 206 along the second lateral direction in a top view. Specifically, the feedthrough via 280 is disposed between two adjacent active regions 206. The feedthrough via 280 extends through at least the substrate 202 to couple a metal line 252C, which is similar to the metal line 252A, to a contact feature 236 on the frontside 202A, and subsequently to the frontside interconnect structures 300, of the eFuse memory cell 201A. Different from the backside via 240, the feedthrough via 280 directly couples the metal line 252C to the contact feature 236, and is thus not coupled to any portion of the sub-transistor t2. The feedthrough via 280 may include a metal fill layer (not depicted separately) over a barrier layer (not depicted separately), similar to the backside via 240.

The feedthrough via 280 has a width 281 defined along the first lateral direction, where the width 281 is greater than the width 241 of the backside via 240 as depicted in FIG. 4. As such, a cross-sectional area of the feedthrough via 280 in the X-Y plane is greater than a cross-sectional area of the backside via 240, leading to a lower resistance than the backside via 240. Compositions of the metal fill layer and the barrier layer may be similar to those of the metal fill layer and the barrier layer of the backside via 240, respectively, as discussed above.

FIG. 6 illustrates a cross-sectional view of the sub-transistor t1 in the eFuse memory cell 201A along line CC' of FIG. 3. The backside via 240 couples the backside interconnect structures 250 to the sub-transistor t1 at one of the source/drain regions 216/218, establishing a connection that delivers the supply voltage $V_{SS}$ to the eFuse memory cell 201A from the backside 202B (e.g., from the SL). The other one of the source/drain regions 216/218 is coupled to the frontside interconnect structures 300, which includes the interconnect structure (e.g., metal structure, metal line) functioning as the fuse resistor 356 (e.g., an implementation of the fuse resistor 150 described above) disposed in the frontside metallization layer 350 (M₂) in the depicted embodiment. The fuse resistor 356 is further coupled to a programming voltage $V_{DD}$ delivered from the frontside interconnect structures 300 (e.g., from the BL). It is noted that the fuse resistor 356 may be alternatively disposed in a different portion of the frontside interconnect structures 300.

FIG. 7 illustrates a cross-sectional view of a portion of the semiconductor device 200 along line DD' of FIG. 3. While FIG. 6 depicts a cross-sectional view of the sub-transistor t1 along the direction of the active region 204, FIG. 7 illustrates a portion of the second region P2 across both the active region 206 and the adjacent dummy region 205. The eFuse memory cell 201A in the second region P2 includes a backside via 244 (also depicted in FIG. 3) that extends vertically (e.g., along the Z axis) through a portion of the substrate 202 and the active region 206 to couple a backside metallization layer (BM$_0$) 252B to one of the source/drain regions 226/228 of the sub-transistor t2, where the metal line 252B (also depicted in FIG. 3) is formed as a part of the backside interconnect structures 250 described above. The backside via 244 extends lengthwise along the second lateral direction as depicted in the layout design of FIG. 3. Through the sub-transistor t2, the backside via 244 couples the backside interconnect structures 250 to the frontside interconnect structures 300 and subsequently to the sub-transistor t1, establishing a conduction path between the sub-transistor t1, the sub-transistor t2, and the backside interconnect structures 250, from where the supply voltage V$_{SS}$ is applied. In some embodiments, the backside via 244 is similar in structure and dimension to the backside via 240 of the eFuse memory cell 201A. In some embodiments, the backside vias 240 and 244 have the same structure and dimension. For example, the backside vias 240 and 244 both have the width 241 as described above.

In addition, still referring to FIG. 7, the semiconductor device 200 in the second region P2 includes the feedthrough via 280 that extends vertically through the dummy region 205 (i.e., the substrate 202) to couple the backside metallization layer 252 (e.g., the metal line 252C) to the contact feature 236, which is further coupled to the frontside interconnect structures 300. This is in contrast to the backside via 244, which couples the metal line 252B to one of the source/drain regions 226/228 of the sub-transistor t2. In the depicted embodiments, the metal lines 252B and 252C are separated from one another along the second lateral direction, as depicted in FIG. 3. Through the contact feature 236, the feedthrough via 280 couples the backside interconnect structures 250 to the frontside interconnect structures 300 and subsequently to the sub-transistor t1, establishing a conduction path between the sub-transistor t1, the sub-transistor t2, and the backside interconnect structures 250, from where the supply voltage V$_{SS}$ is applied. As feedthrough vias generally exhibit a lower resistance than backside vias as described above due to larger cross-sectional areas, by incorporating the feedthrough via 280 in the second region P2 the resistance of the conduction path can be further reduced.

In some embodiments, the feedthrough via 280 has a height W3 extending along the second lateral direction. In this regard, the placement of the feedthrough via 280 between the active regions 206 indicates that the height N of the dummy region 205 exceeds the height W3 of the feedthrough via 280. In some embodiments, the height W3 is about 70 nm and the height N is at least about 72 nm. In some embodiments, the height W3 is determined based on the height N or the height W2 of the active region 206, given a constant cell height H2 of the second region P2. In the depicted embodiments, because the height M of the dummy region 203 in the eFuse memory cell 201A is less than the height W3, the first region P1 does not include any feedthrough vias.

Referring to FIGS. 6 and 7 collectively, additional details of the frontside interconnect structures 300 and the backside interconnect structures 250 are also illustrated. For example, the frontside interconnect structures 300 further include a frontside metallization layer 330 disposed above and interconnected to the frontside metallization layer 310 by vias 320A, 320B, 320C, 320D, and 320E, collectively referred to as via 320 (V$_0$). Additional frontside metallization layers over the frontside metallization layer 310 (M$_0$) may be designated as M$_1$, M$_2$, . . . , and M$_n$, where adjacent frontside metallization layers are interconnected by vias V$_1$, V$_2$, . . . V$_{n-1}$, respectively. Each of the frontside metallization layer includes one or more metal lines that is electrically coupled to a corresponding via. In the depicted embodiment, the frontside metallization layers M$_1$ and M$_2$ correspond to frontside metallization layers 330 (including metal lines 330A, 330B, and 330C) and 350 (including metal lines 350A, 350B, and 350C), respectively, and the via V$_1$ corresponds to vias 340 (including vias 340A, 340B, and 340C). In some embodiments, the sub-transistors t1, the sub-transistors t2, and the feedthrough vias 280 are coupled to a common metal line, such as the metal line 330A, in the frontside interconnect structures 300, forming a parallel connection therebetween.

Similarly, the backside interconnect structures 250 include a plurality of backside metallization layers, such as BM$_0$, BM$_1$, . . . and BM$_n$, coupled together by vias, such as BV$_0$, BV$_1$, . . . BV$_{n-1}$. For example, the backside metallization layer 252 (BM$_0$), which includes metal lines 252A, 252B, and 252C, is interconnected to a backside metallization layer 254 (BM$_1$), which includes metal lines 254A, 254B, and 254C, by one or more of vias 272A, 272B, 272C, and 272D, which are collectively referred to as via 272 (BV$_0$).

It is noted that, for purposes of simplicity and clarity, various dielectric (e.g., insulating) layers within which the frontside and backside metallization layers (including the interconnect structures) are formed are omitted from the depiction of various embodiments of the eFuse memory cells in the present disclosure. These dielectric layers may include, for example, etch-stop layers (ESLs), interlayer dielectric (ILD) layers, and intermetal dielectric (IMD) layers, to name a few. In addition, the substrate 202 extending below the active regions 204 and 206 and the dummy regions 203 and 205 is also omitted in the cross-sectional views of various eFuse memory cells depicted in FIGS. 6, 7, 9-11, 13-15, 17, 18, 20, and 21. It is further noted that for purposes of clarity detailed references to various metal lines and vias in the frontside interconnect structures 300 and the backside interconnect structures 250, as they are labeled in FIGS. 6 and 7, are not repeated in cross-sectional views of the various eFuse memory cells in subsequent FIGS. 9-11, 13-15, 17, 18, 20, and 21.

In some embodiments, referring to FIGS. 8-11, the semiconductor device 200 includes a plurality of eFuse memory cells 201B. In some embodiments, the eFuse memory cell 201B is similar to the eFuse memory cell 201A. For example, cross-sectional views of the eFuse memory cell 201B along the line CC' and the line DD' depicted in FIGS. 9 and 10, respectively, are similar to those of the eFuse memory cell 201A depicted in FIGS. 6 and 7, respectively.

Figure 8:
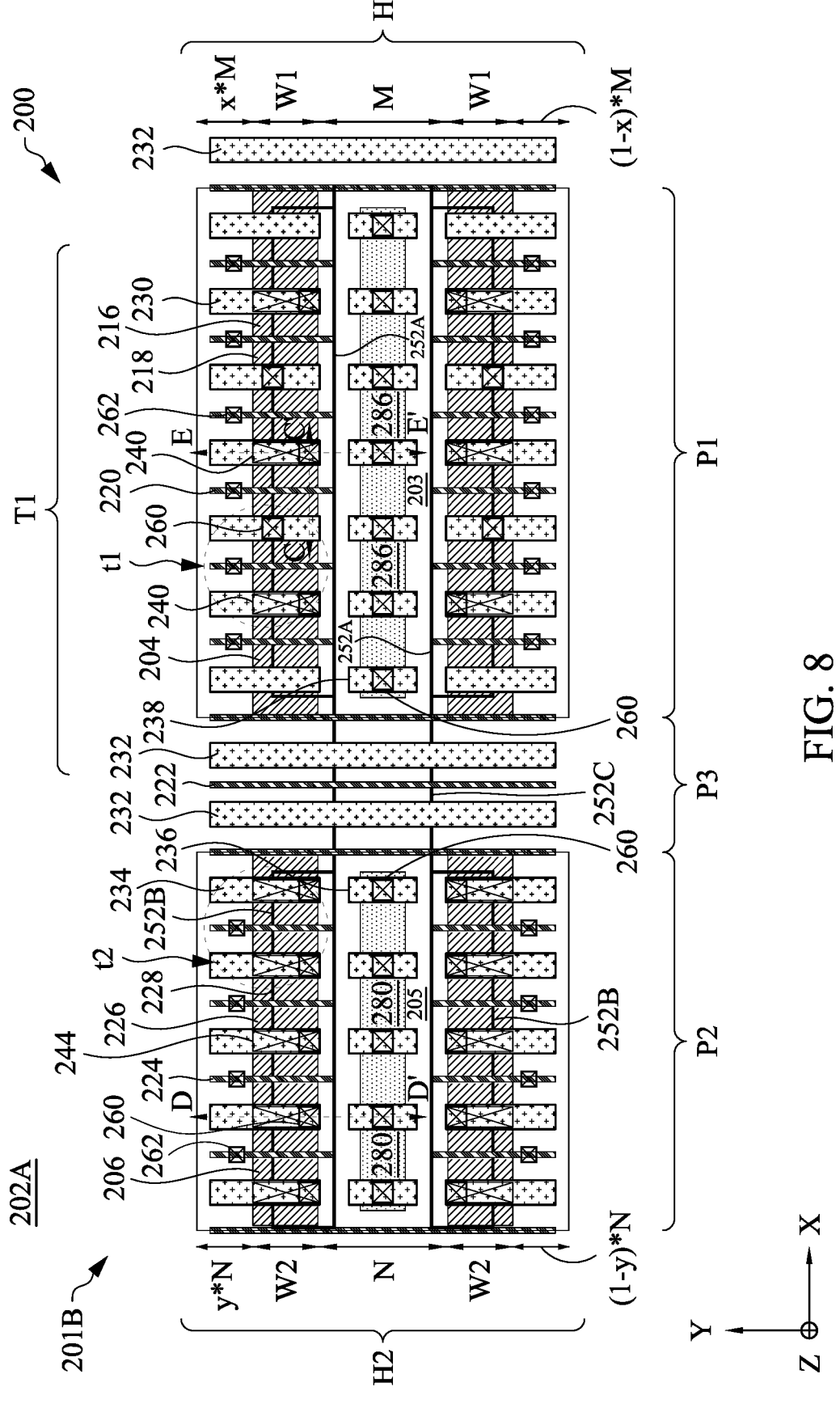
Figure 9:
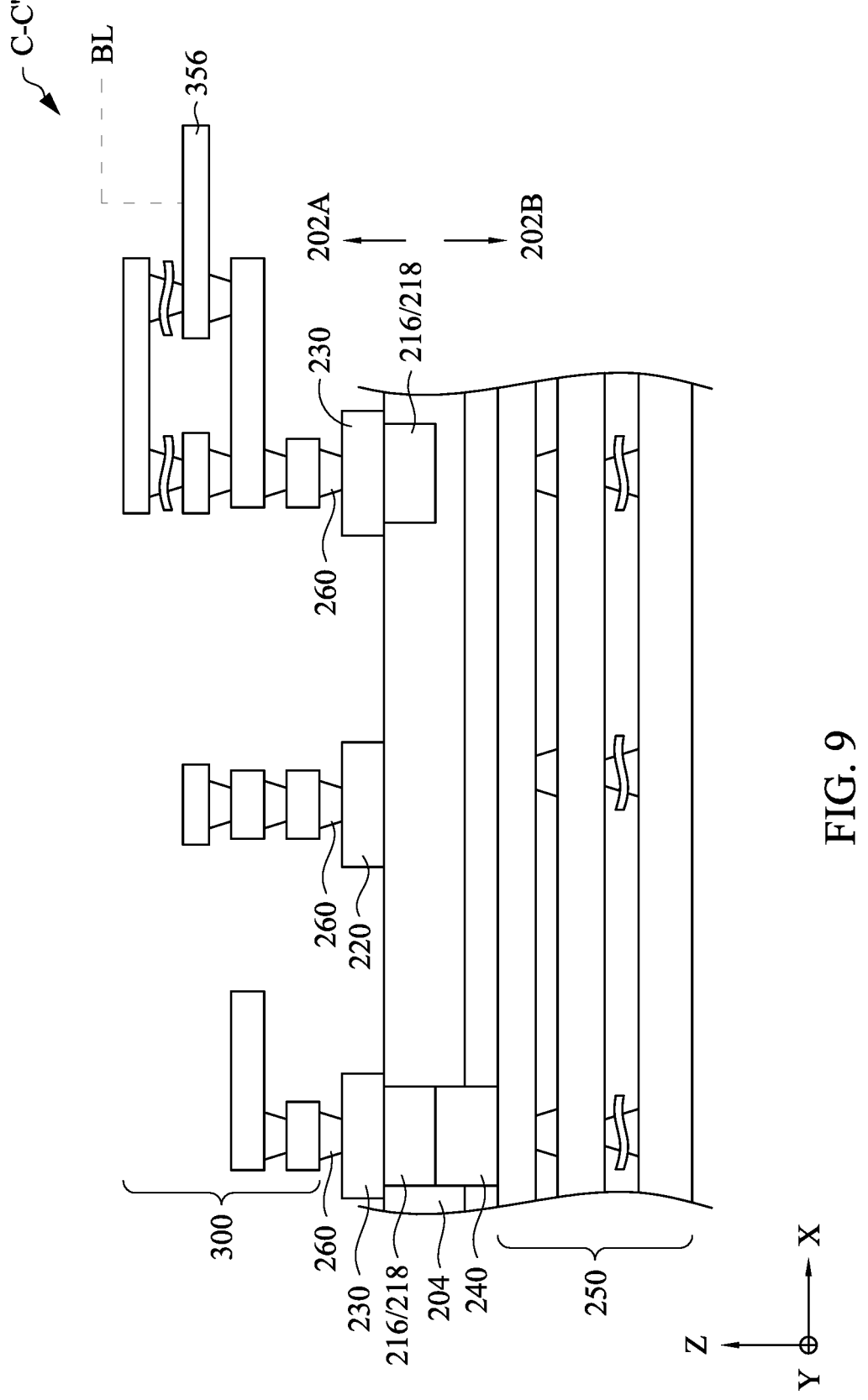
Figures 10, 11:
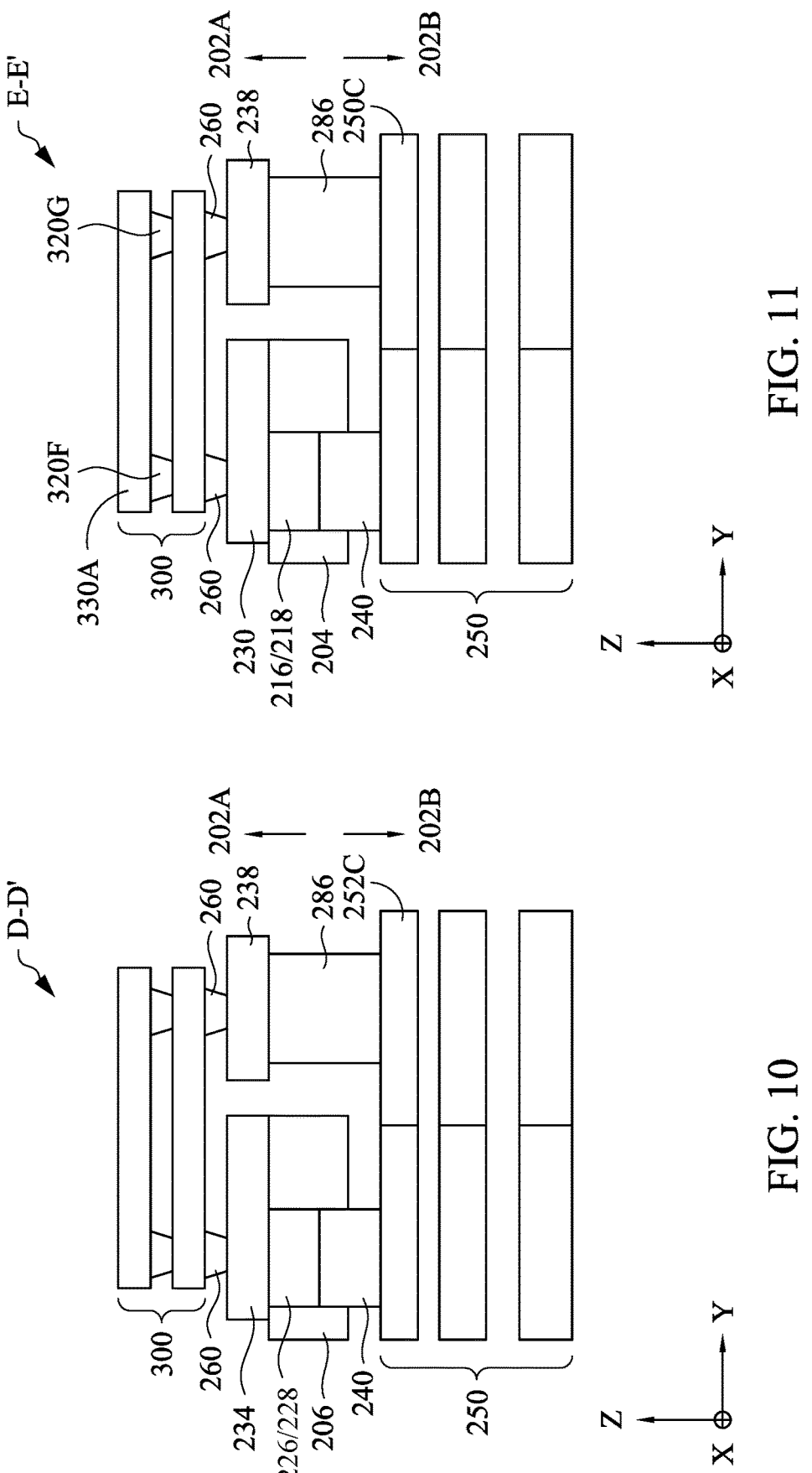
FIGS. 11, 15, and 21 each illustrate a schematic cross-sectional view along line EE' of the example memory cell of FIGS. 8, 12, and 19, respectively, in accordance with some embodiments.

However, different from the eFuse memory cell 201A depicted in FIGS. 3, 6, and 7, the dummy region 203 of the eFuse memory cell 201B includes a feedthrough via 286. Referring to FIG. 8, which depicts a frontside layout design, and to FIG. 11, which depicts a cross-sectional view along line EE' of FIG. 8 the dummy region 203 in the first region P1 is configured to have the height M that exceeds the height W3 of the feedthrough via 286. In this regard, for a given cell height H1, which is substantially the same as the cell height H2 in the depicted embodiment, the height W1 of the active regions 204 is reduced to enlarge an area of the dummy region 203, allowing the layout of the first region P1 to accommodate the placement of the feedthrough via 286. In some embodiments, the reduced height W1 does not exceed the height W2 of the active regions 206 in the second region P2. In some embodiments, the reduced height W1 does not exceed the height W2 of the active regions 206 in the second region P2. In some embodiments, the reduced height W1 is greater than the height W2 of the active regions 206. In some embodiments, instead of reducing the height W1, the active regions 204 are further spaced apart along the second lateral direction to enlarge the height M of the dummy region 203.

In some embodiments, the feedthrough via 286 is similar in structure and dimension to the feedthrough via 280 of the eFuse memory cell 201A. In some embodiments, the feedthrough vias 280 and 286 have the same structure and dimension. For example, the feedthrough vias 280 and 286 have the same height W3 and the width 281 as described above. Furthermore, comparing FIG. 10 to FIG. 11, the feedthrough via 286 couples the backside interconnect structures 250 (e.g., the metal line 252C) to contact features 238, which are further coupled to the frontside interconnect structures 300 (e.g., to the metal line 330A though vias 320F and 320G, for example), while the feedthrough via 280 couples the backside interconnect structures 250 (e.g., the metal line 252C) to the contact features 236. The incorporation of the feedthrough via 286 in the first region P1 further reduces the resistance of the conduction path between the sub-transistor t1, the sub-transistor t2, and the backside interconnect structures 250, from where the supply voltage $V_{SS}$ is applied.

Figure 12:
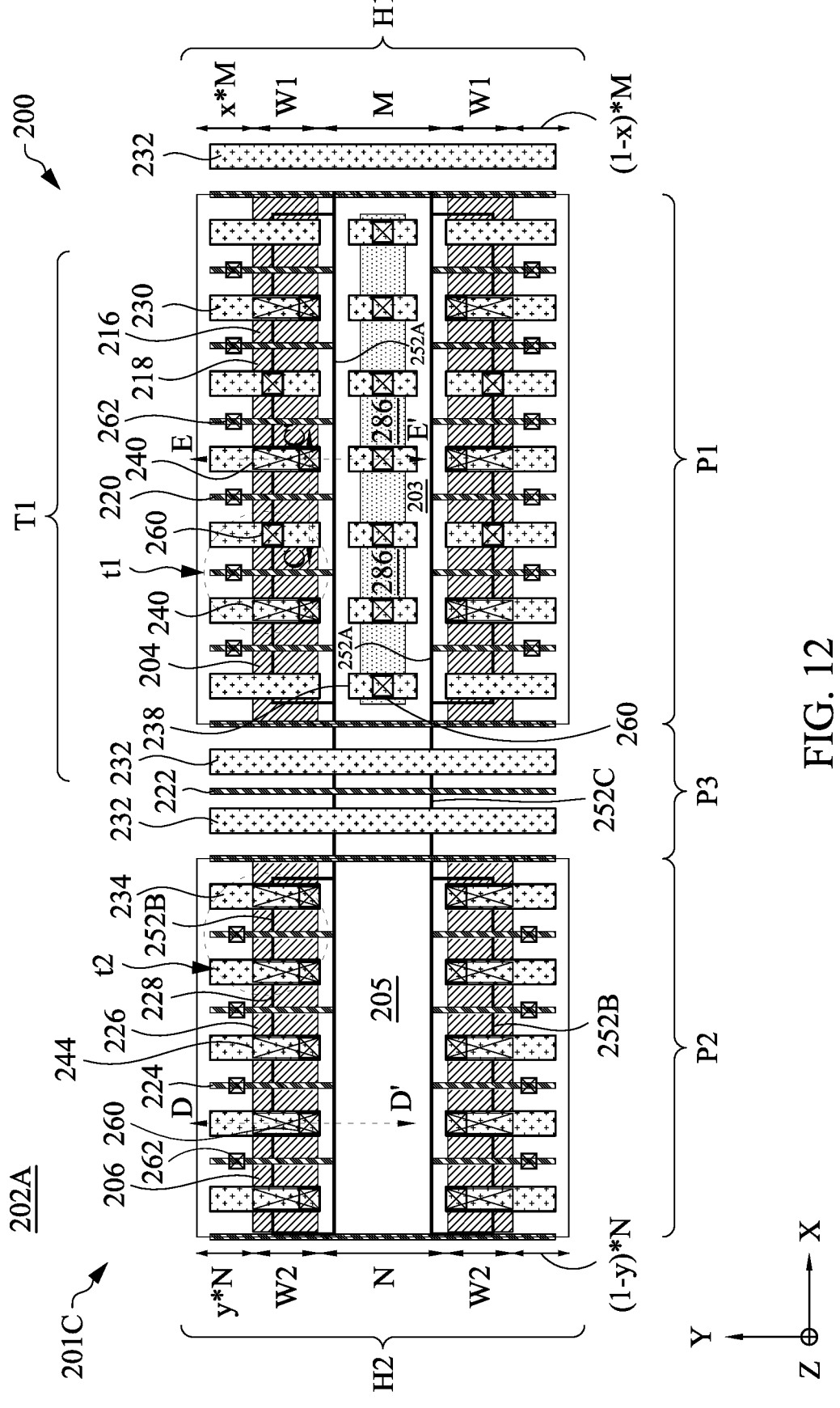
Figure 13:
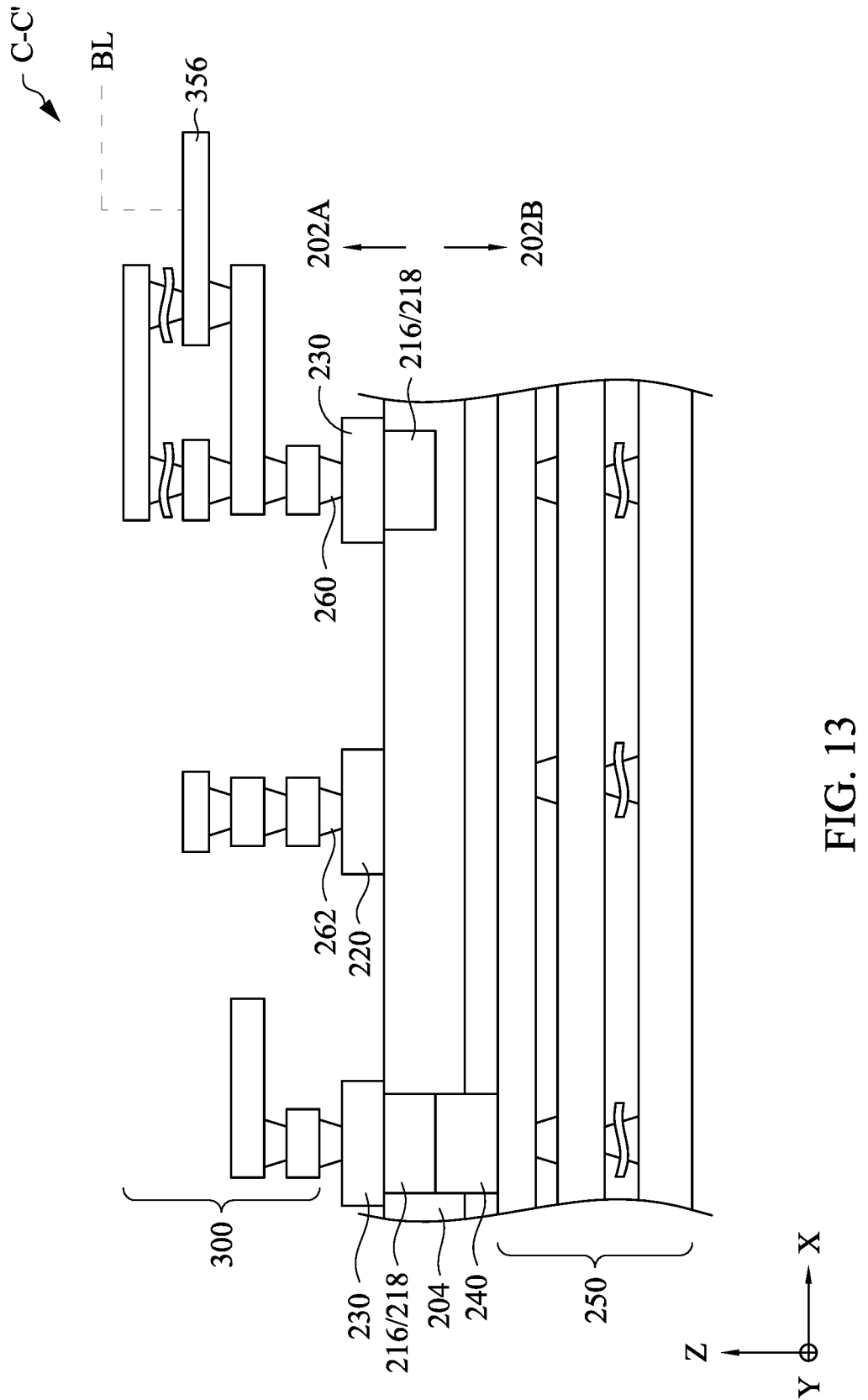
Figure 15:
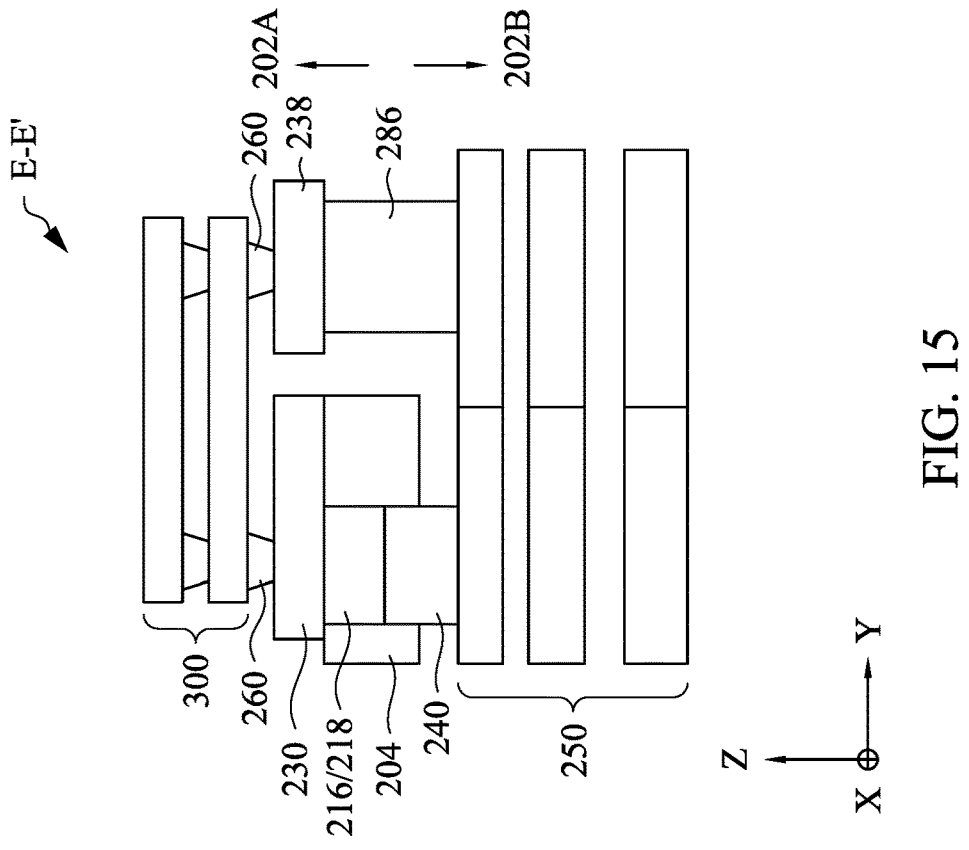
Figure 14:
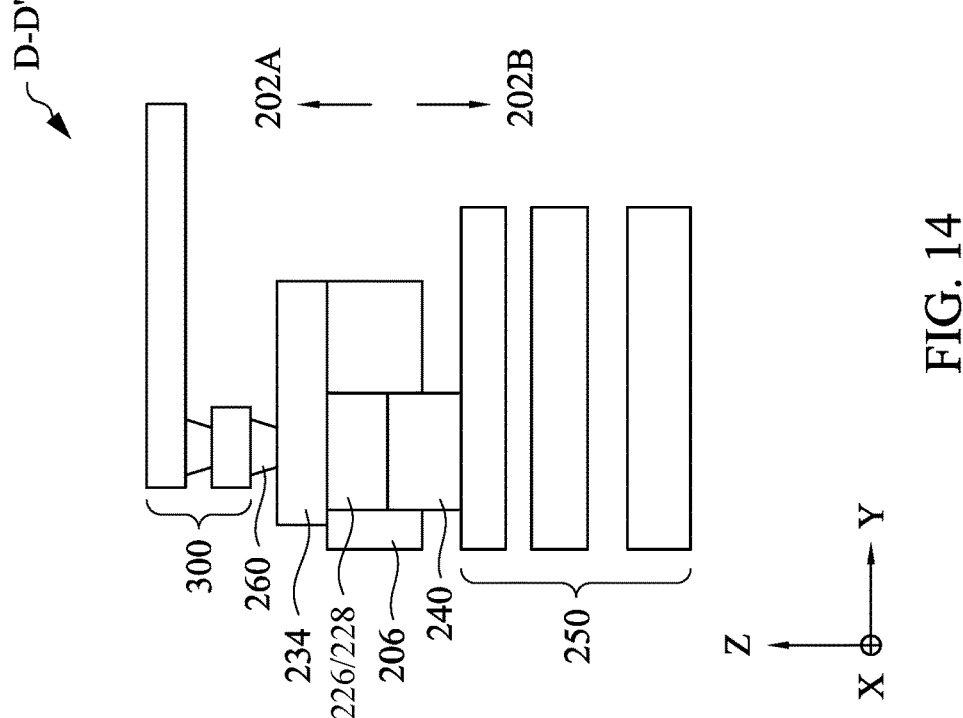

In some embodiments, referring to FIGS. 12-15, the semiconductor device 200 includes a plurality of eFuse memory cells 201C, where FIG. 12 depicts a frontside layout design of the eFuse memory cell 201C and FIG. 14 depicts a cross-sectional view of the eFuse memory cell 201C along the line DD' of FIG. 12. In some embodiments, the eFuse memory cell 201C is similar to the eFuse memory cell 201B. For example, cross-sectional views of the eFuse memory cell 201C along the line CC' and the line EE' depicted in FIGS. 13 and 15, respectively, are similar to those of the eFuse memory cell 201B depicted in FIGS. 9 and 11, respectively. In this regard, the dummy region 203 in the first region P1 of the eFuse memory cell 201C is configured to have the height M that exceeds the height W3 of the feedthrough via 286, and the height W1 of the active regions 204 does not exceed the height W2 of the active regions 206.

However, different from the eFuse memory cell 201B depicted in FIGS. 8-11 and referring to FIGS. 12 and 14, the dummy region 205 of the eFuse memory cell 201C does not include any feedthrough via 280. Accordingly, the resistance of the conduction path between the sub-transistor t1, the sub-transistor t2, and the backside interconnect structures 250 in the eFuse memory cell 201C may be similar to that of the eFuse memory cell 201A but greater than that of the eFuse memory cell 201B.

Figure 16:
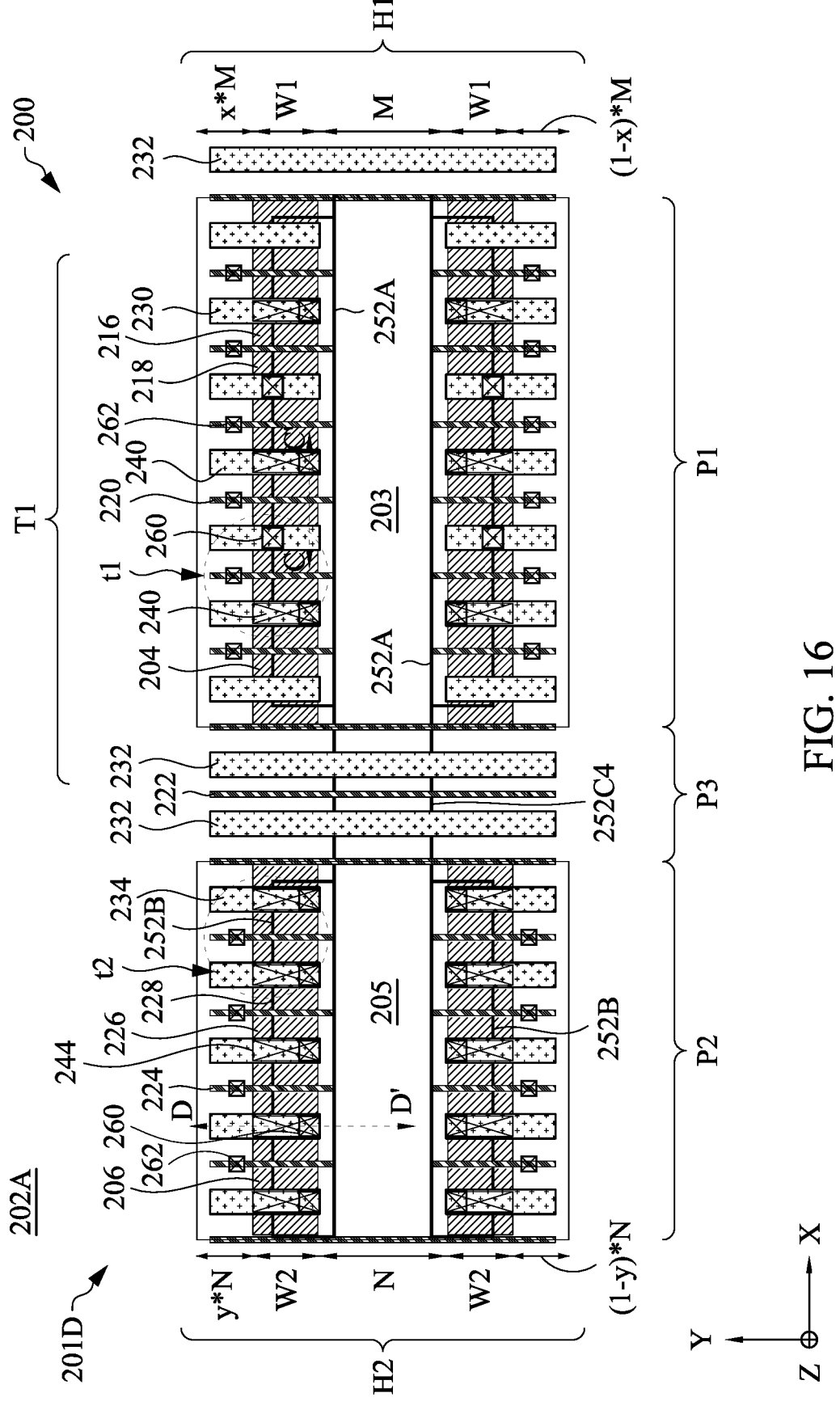
Figure 17:
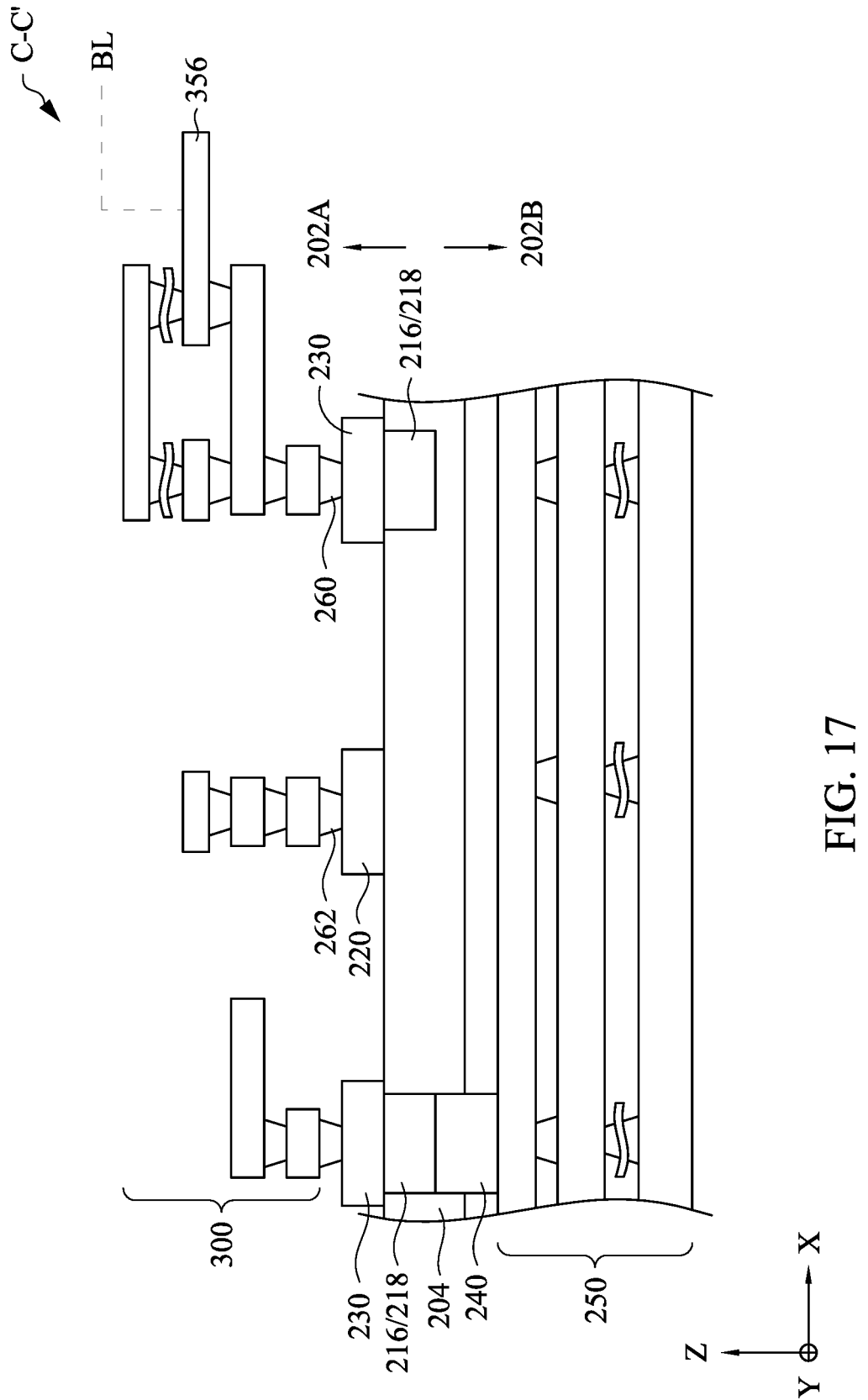
Figure 18:
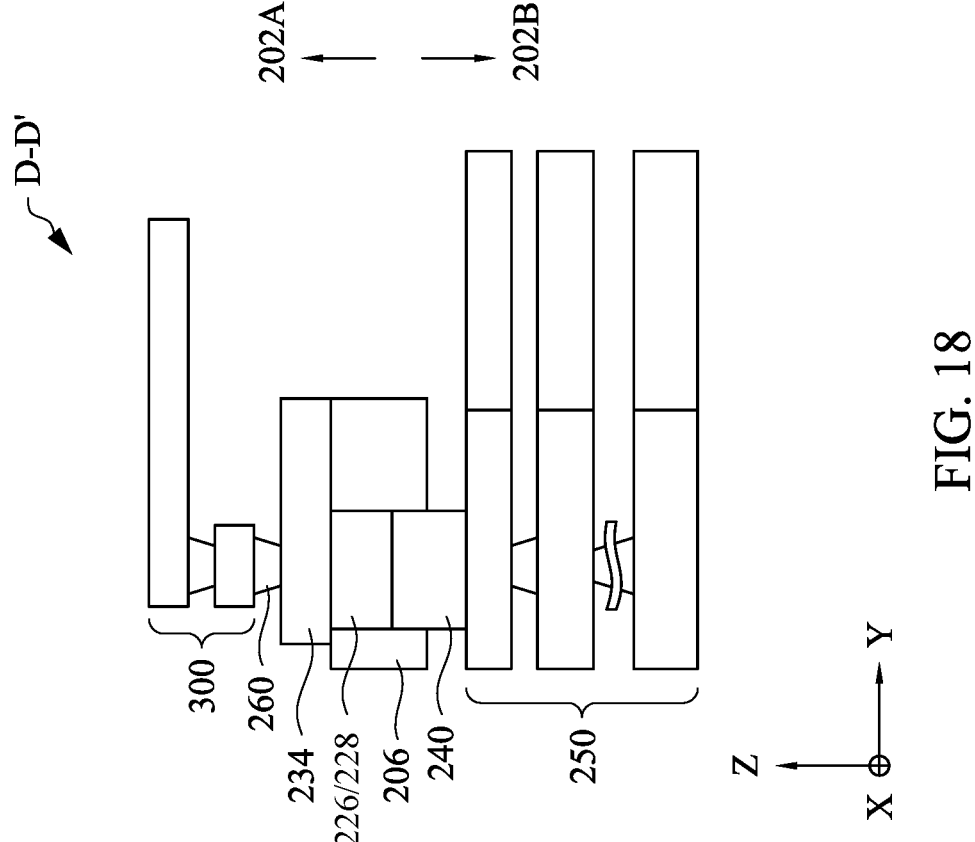

In some embodiments, referring to FIGS. 16-18, the semiconductor device 200 includes a plurality of eFuse memory cells 201D, where FIG. 16 depicts a frontside layout design of the eFuse memory cell 201D and FIG. 18 depicts a cross-sectional view of the eFuse memory cell 201D along the line DD' of FIG. 16. In some embodiments, the eFuse memory cell 201D is similar to the eFuse memory cell 201A. For example, a cross-sectional view of the eFuse memory cell 201D along the line CC' in FIG. 17 is similar to that of the eFuse memory cell 201A depicted in FIG. 6.

Different from the eFuse memory cell 201A depicted in FIGS. 3, 6, and 7 and referring to FIGS. 16 and 18, the dummy region 205 of the eFuse memory cell 201D does not include any feedthrough via 280. Accordingly, the resistance of the conduction path between the sub-transistor t1, the sub-transistor t2, and the backside interconnect structures 250 in the eFuse memory cell 201D may be greater than that of the eFuse memory cells 201A-201C. However, omitting the feedthrough vias 280 and 286 can have at least the benefit of reducing complexity and cost of the fabrication process by using one less mask (or photomask) to perform a photolithography process in forming the feedthrough vias.

Figure 19:
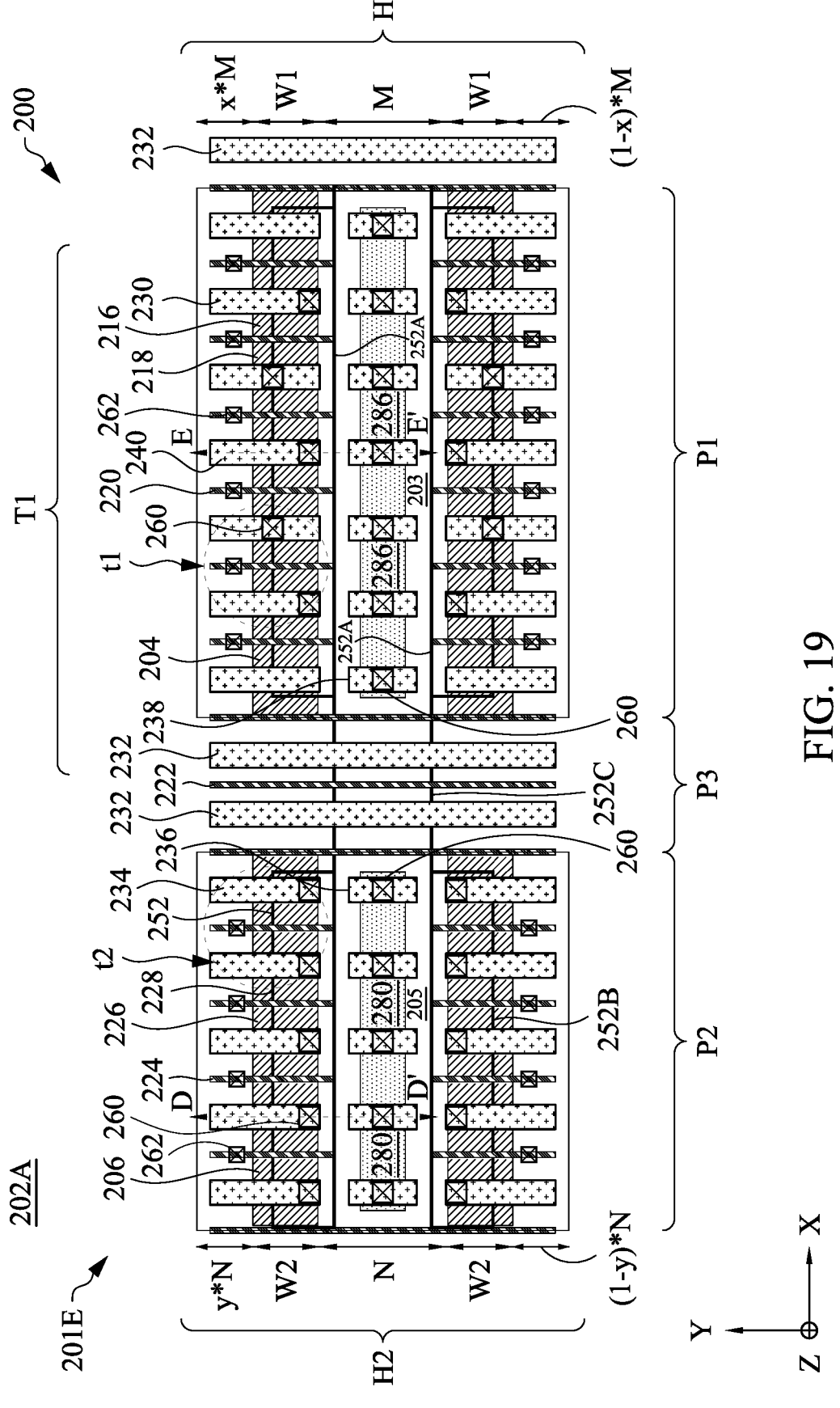
Figures 20, 21:
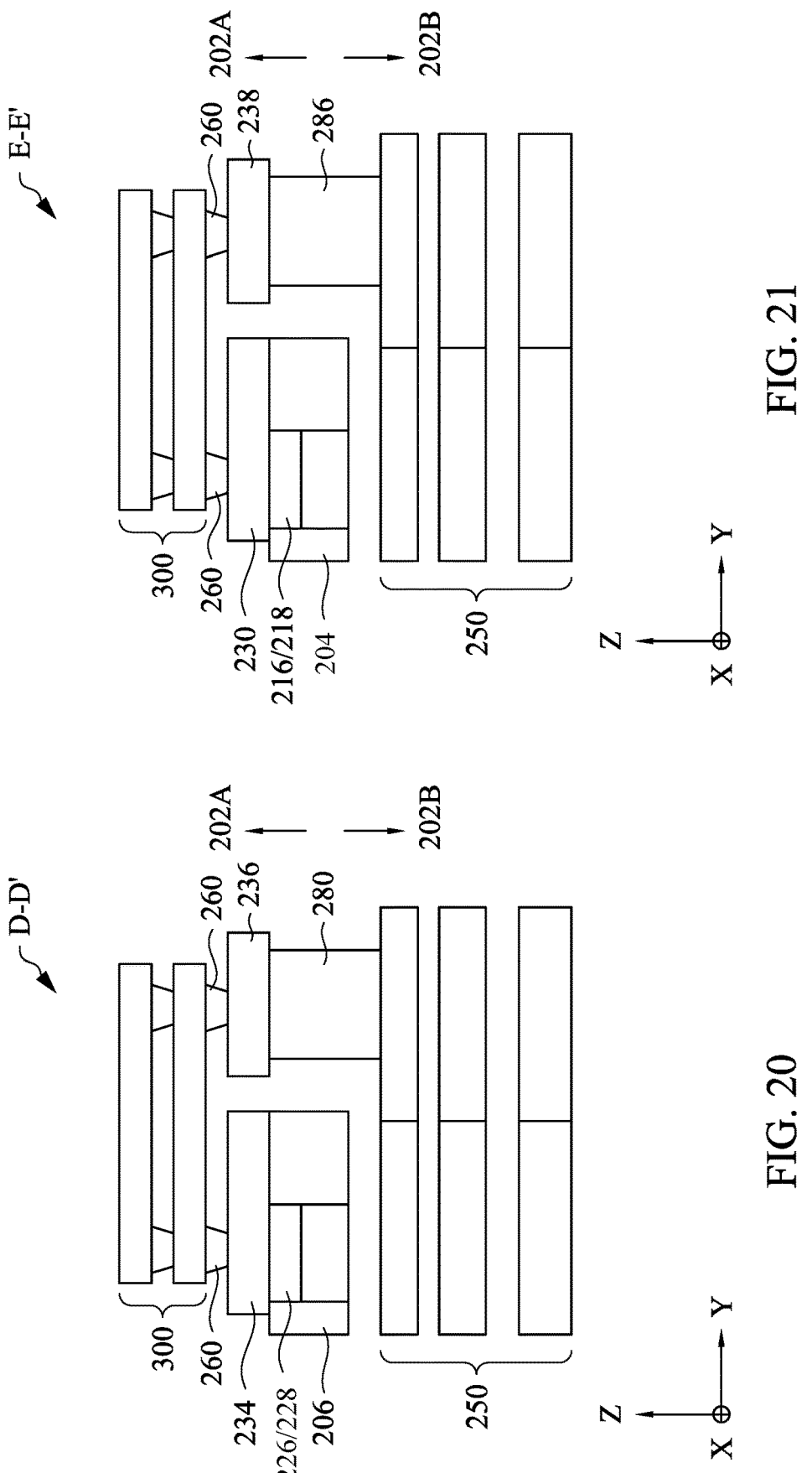

In some embodiments, referring to FIGS. 19-21, the semiconductor device 200 includes a plurality of eFuse memory cells 201E, where FIG. 19 depicts a frontside layout design of the eFuse memory cell 201E, FIG. 20 depicts a cross-sectional view of the eFuse memory cell 201E along the line DD' of FIG. 19, and FIG. 21 depicts a cross-sectional view of the eFuse memory cell 201E along the line EE' of FIG. 19. In some embodiments, the eFuse memory cell 201E is similar to the eFuse memory cell 201B. For example, the dummy regions 203 and 205 of the eFuse memory cell 201E include the feedthrough vias 280 and 286, respectively. However, different from the eFuse memory cell 201B, both of the first region P1 and the second region P2 of the eFuse memory cell 201E are free of any backside vias, i.e., the backside vias 240 and 244, respectively, that are present in the eFuse memory cell 201B. In this regard, while the resistance of the conduction path between the sub-transistor t1, the sub-transistor t2, and the backside interconnect structures 250 in the eFuse memory cell 201E may be greater than that of the eFuse memory cells 201B, omitting the backside vias 240 and 244 can have at least the benefit of reducing complexity and cost of the fabrication process, similar to the benefit of omitting the feedthrough vias 280 and 286 in the structure of the eFuse memory cell 201D.

Figure 22:
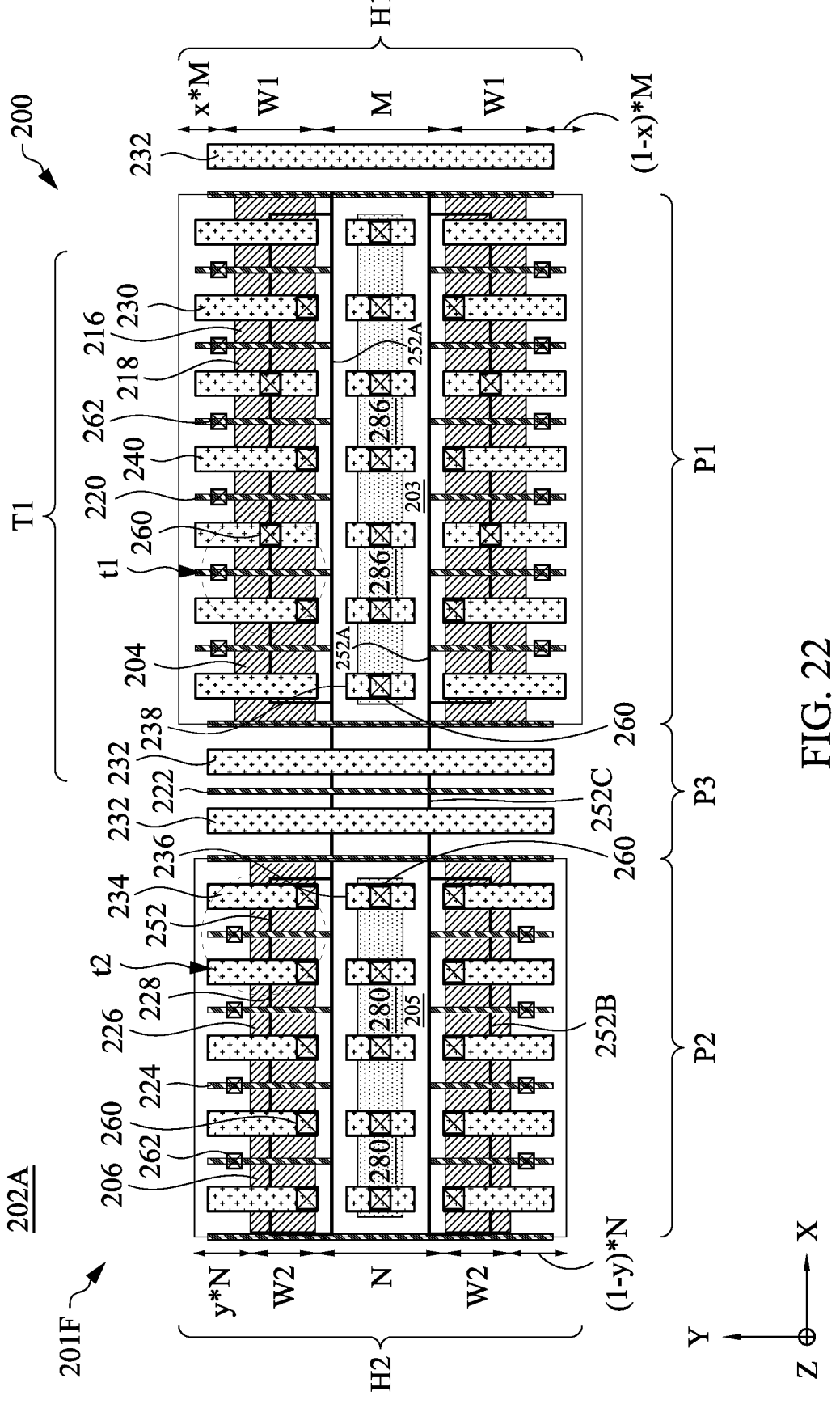

In some embodiments, the semiconductor device 200 includes a plurality of eFuse memory cells 201F, where FIG. 22 depicts a frontside layout design of the eFuse memory cell 201F. In some embodiments, the eFuse memory cell 201F is similar to the eFuse memory cell 201E. For example, comparing FIG. 19 with FIG. 22, each of the eFuse memory cells 201E and 201F includes the feedthrough via 286 in the first region P1 and the feedthrough via 280 in the second region P2, but is free of any of the backside vias 240 and 244.

However, different from the eFuse memory cell 201E, the cell height H1 of the first region P1 is greater than the cell height H2 of the second region P2 in the eFuse memory cell 201F. The increase in the cell height H1 may be a result of increasing the height W1 of the active regions 204, which can have the benefit of improving speed of the sub-transistor t1, increasing the height M of the dummy region 203, which can have the benefit of reducing the resistance of the feedthrough via 286, or both. In some embodiments, the height W1 of the active region 204 is at least the same as (i.e., equal to or greater than) the height W2 of the active region 206 and the height M of the dummy region 203 is at least the same as the height N of the dummy region 205 in the eFuse memory cell 201F. In some embodiments, the height M is less than the height N of the dummy region 205. In further embodiments, the presence of the feedthrough vias 280 and 286 indicates that both the height M and the height N are greater than the height W3 of the feedthrough via 280/286.

Figure 23:
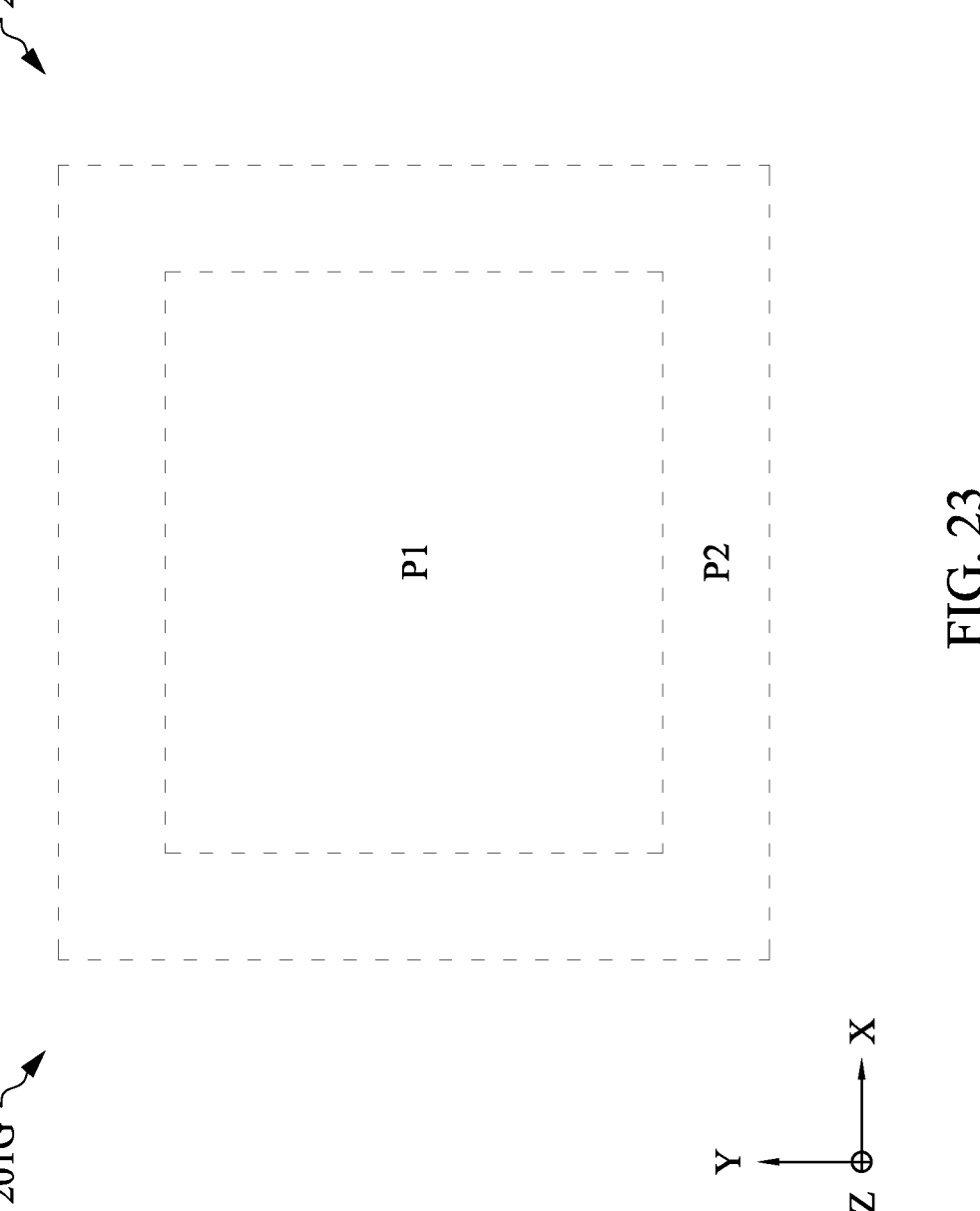

FIG. 23 depicts a schematic top view of an example eFuse memory cell 201G. The eFuse memory cell 201G may be similar to any one of the eFuse memory cells 201A-201F as described above with the exception that the second region P2 surrounds or encloses the first region P1, rather than extends alongside the first region P1 as in the case for the eFuse memory cells 201A-201F. In this regard, the second region P2 may serve as a guard ring structure coupled to the first region P1.

Figure 24:
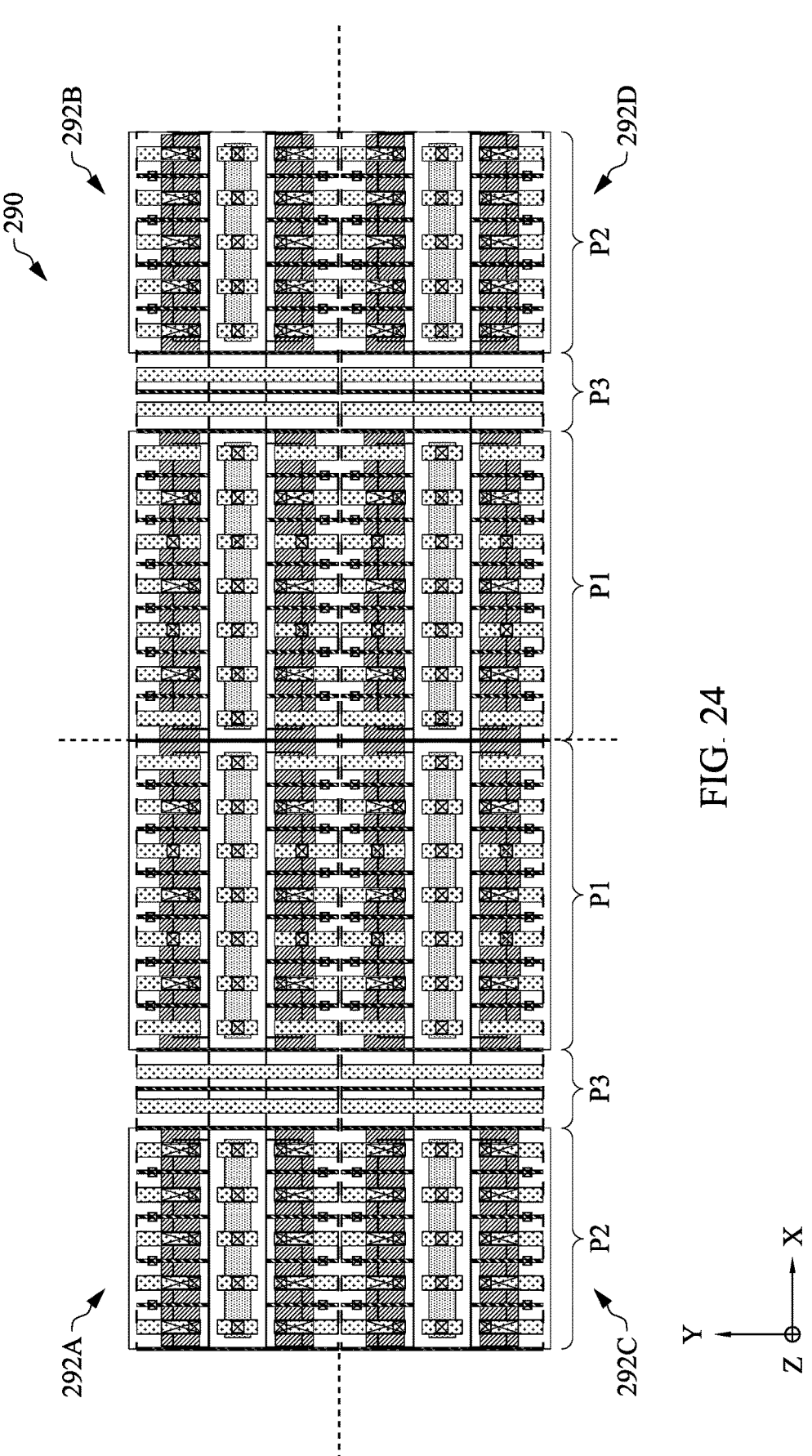
FIG. 24 illustrates an example layout design including multiple memory cells selected from the example memory cells illustrated in FIGS. 3-23, in accordance with some embodiments.

Referring to FIG. 24, a frontside layout design of an example semiconductor device 290 is depicted. The semiconductor device 290 includes a plurality of eFuse memory cells 292A, 292B, 292C, and 292D arranged in a layout design as depicted. The eFuse memory cells 292A-292D are identical in configuration and a may be similar to any one of the eFuse memory cells 201A-201G as described above. In the depicted embodiment, the eFuse memory cells 292A-292D are arranged in a two-by-two (2×2) layout, where the eFuse memory cells 292A and 292B are adjacent to one another along the first lateral direction (e.g., the X axis) and mirror images of one another about the second lateral direction (e.g., the Y axis), and the eFuse memory cells 292C and 292D are adjacent to one another along the first lateral direction and mirror images of one another about the second lateral direction. Similarly, the eFuse memory cells 292A and 292C are adjacent to one another along the second lateral direction and mirror images of one another about the first lateral direction, and the eFuse memory cells 292B and 292D are adjacent to one another along the second lateral direction and mirror images of one another about the first lateral direction. It is noted that the eFuse memory cells 292A-292D may be arranged in any other suitable layouts, according to some embodiments of the present disclosure.

Figure 25:
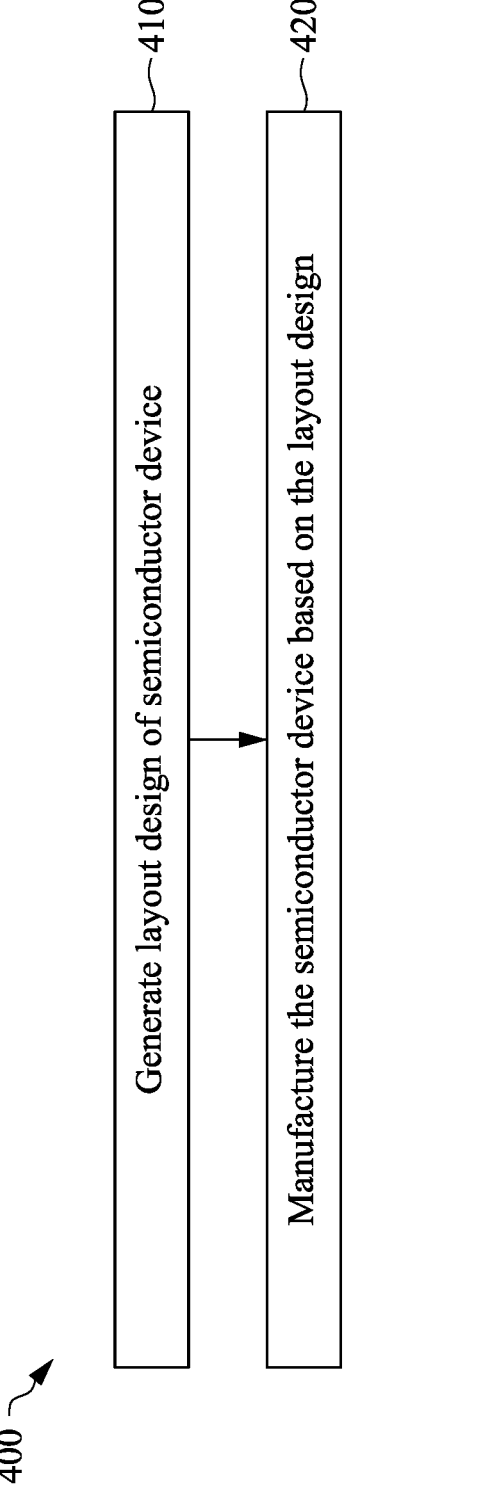
FIG. 25 illustrates a flowchart of a method of manufacturing a semiconductor device, in accordance with some embodiments.

FIG. 25 is a flowchart of a method 400 of forming or manufacturing a semiconductor device, such as the semiconductor devices 200 and 290, in accordance with some embodiments. It is understood that additional operations may be performed before, during, and/or after the method 400 depicted in FIG. 25. In some embodiments, the method 400 is usable to form a semiconductor device, according to various layouts (designs) as disclosed herein.

In operation 410 of the method 400, a layout design of a semiconductor device (e.g., the semiconductor device 200 having a layout corresponding to the structure of any of the eFuse memory cells 201A-201G; see FIGS. 3-24) is generated. The operation 410 is performed by a processing device (e.g., processor 502 of FIG. 26) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system (GDSII) file format.

In operation 420 of the method 400, a semiconductor device is manufactured based on the layout design. In some embodiments, the operation 420 of the method 400 includes manufacturing at least one mask based on the layout design, and manufacturing a semiconductor device based on the at least one mask. A number of example manufacturing operations of the operation 420 will be discussed with respect to the method 700 of FIG. 28 below.

In some embodiments, the method 400 is implemented as a standalone software application for execution by a processor. In some embodiments, the method 400 is implemented as a software application that is a part of an additional software application. In some embodiments, the method 400 is implemented as a plug-in to a software application. In some embodiments, the method 400 is implemented as a software application that is a portion of an EDA tool. In some embodiments, the method 400 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSOR. In some embodiments, the layout design is generated based on a netlist which is created based on the schematic design.

Figure 26:
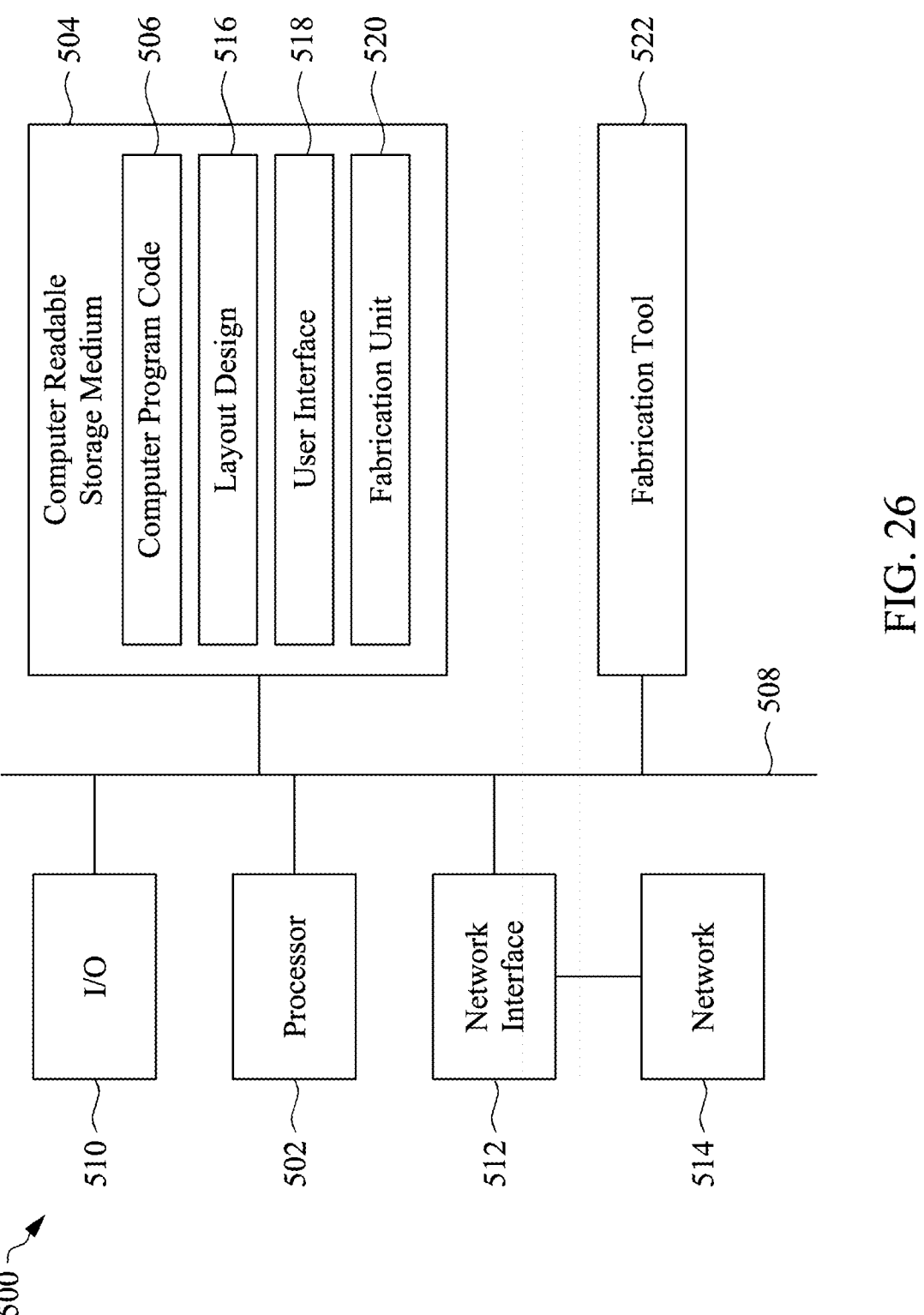
FIG. 26 illustrates a block diagram of a system of generating an IC layout design, in accordance with some embodiments.

FIG. 26 is a schematic view of a system 500 for designing and manufacturing an IC layout design, in accordance with some embodiments. The system 500 generates or places one or more IC layout designs, as described herein. In some embodiments, the system 500 manufactures one or more semiconductor devices based on the one or more IC layout designs, as described herein. The system 500 includes a (e.g., hardware) processor 502 and a non-transitory, computer readable storage medium 504 encoded with, e.g., storing, computer program code 506, e.g., a set of executable instructions. The computer readable storage medium 504 is configured to interface with manufacturing machines for producing the semiconductor device. The processor 502 is electrically coupled to the computer readable storage medium 504 by a bus 508. The processor 502 is also electrically coupled to an I/O interface 510 by the bus 508. A network interface 512 is also electrically connected to the processor 502 by the bus 508. Network interface 512 is connected to a network 514, so that the processor 502 and the computer readable storage medium 504 can connect to external elements via network 514. The processor 502 is configured to execute the computer program code 506 encoded in the computer readable storage medium 504 to cause the system 500 to be usable for performing a portion or all of the operations as described in method 400.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random-access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the computer readable storage medium 504 stores the computer program code 506 configured to cause the system 500 to perform the method 400. In some embodiments, the computer readable storage medium 504 also stores information needed for performing the method 400 as well as information generated during the performance of the method 400, such as layout design 516, user interface 518, fabrication unit 520, and/or a set of executable instructions to perform the operation of method 400.

In some embodiments, the computer readable storage medium 504 stores instructions (e.g., the computer program code 506) for interfacing with manufacturing machines. The instructions (e.g., the computer program code 506) enable the processor 502 to generate manufacturing instructions readable by the manufacturing machines to effectively implement the method 400 during a manufacturing process.

The system 500 includes the I/O interface 510. The I/O interface 510 is coupled to external circuitry. In some embodiments, the I/O interface 510 includes a keyboard, keypad, mouse, trackball, trackpad, and/or cursor direction keys for communicating information and commands to the processor 502.

The system 500 also includes the network interface 512 coupled to the processor 502. The network interface 512 allows the system 500 to communicate with the network 514, to which one or more other computer systems are connected. The network interface 512 includes wireless network interfaces such as BLUETOOTH, WIFI, WIMAX, GPRS, or WCDMA; or wired network interface such as ETHERNET, USB, or IEEE-13154. In some embodiments, the method 400 is implemented in two or more systems 500, and information such as layout design, user interface and fabrication unit are exchanged between different systems 500 by the network 514.

The system 500 is configured to receive information related to a layout design through the I/O interface 510 or network interface 512. The information is transferred to the processor 502 by the bus 508 to determine a layout design for producing an IC. The layout design is then stored in the computer readable storage medium 504 as the layout design 516. The system 500 is configured to receive information related to a user interface through the I/O interface 510 or network interface 512. The information is stored in the computer readable storage medium 504 as the user interface 518. The system 500 is configured to receive information related to a fabrication unit through the I/O interface 510 or network interface 512. The information is stored in the computer readable storage medium 504 as the fabrication unit 520. In some embodiments, the fabrication unit 520 includes fabrication information utilized by the system 500.

In some embodiments, the method 400 is implemented by a manufacturing device to manufacture an integrated circuit using a set of masks manufactured based on one or more layout designs generated by the system 500. In some embodiments, the system 500 includes a manufacturing device (e.g., fabrication tool 522) to manufacture an integrated circuit using a set of masks manufactured based on one or more layout designs of the present disclosure. In some embodiments, the system 500 of FIG. 26 generates layout designs of an IC that are smaller than other approaches. In some embodiments, the system 500 of FIG. 26 generates layout designs of a semiconductor device that occupy less area than other approaches.

Figure 27:
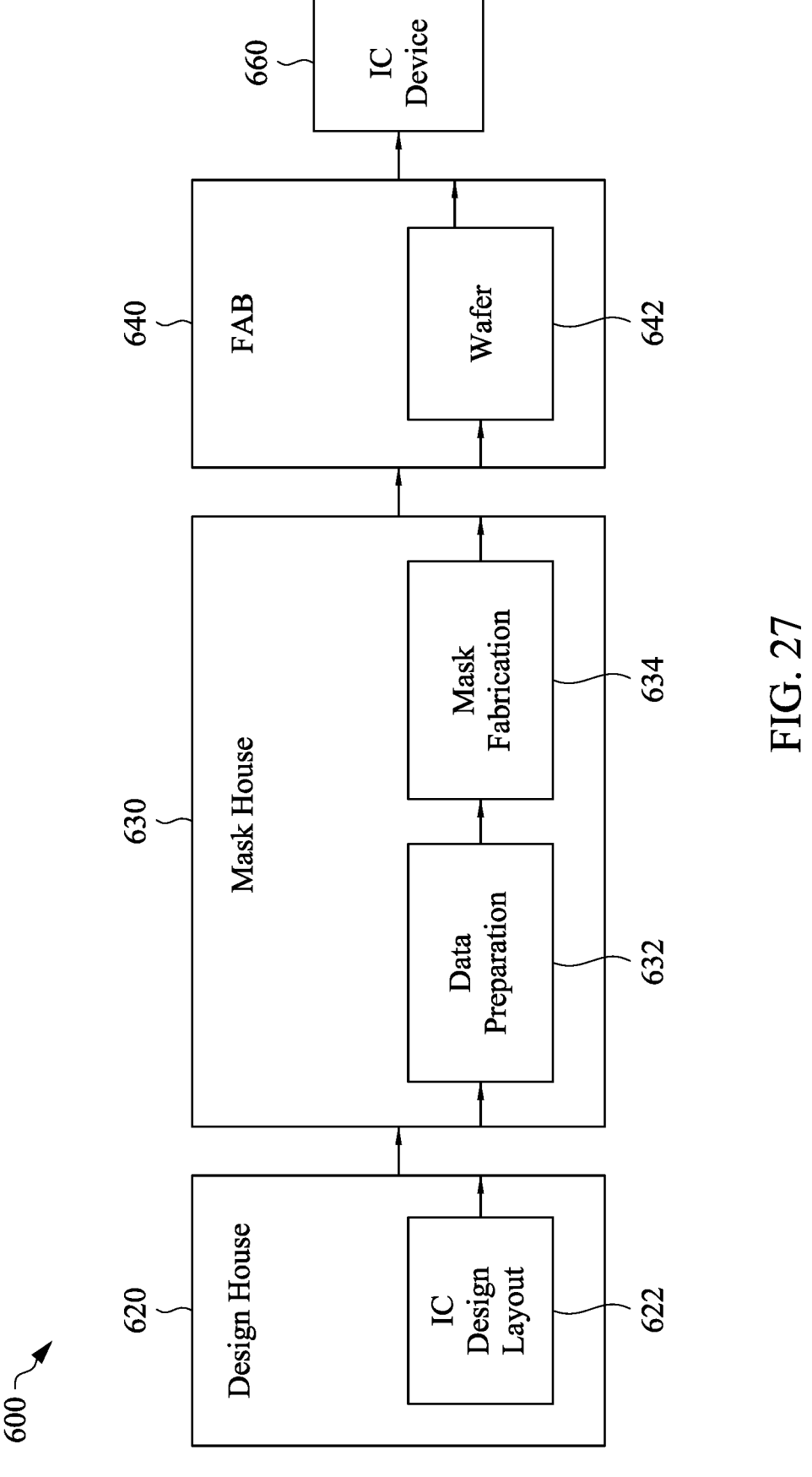
FIG. 27 illustrates a block diagram of an IC manufacturing system, and an IC manufacturing flow associated therewith, in accordance with some embodiments.

FIG. 27 is a block diagram of an integrated circuit (IC)/semiconductor device manufacturing system 600, and an IC manufacturing flow associated therewith, in accordance with at least one embodiment of the present disclosure.

In FIG. 27, the IC manufacturing system 600 includes entities, such as a design house 620, a mask house 630, and an IC manufacturer/fabricator ("fab") 640, that interact with one another in the design, development, and manufacturing cycles and/or services related to manufacturing an IC device (semiconductor device) 660 (e.g., corresponding to the semiconductor device 200 or 290). The entities in the IC manufacturing system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 640 is owned by a single company. In some embodiments, two or more of design house 620, mask house 630, and IC fab 640 coexist in a common facility and use common resources.

The design house (or design team) 620 generates an IC design layout 622. The IC design layout 622 includes various geometrical patterns designed for the IC device 660. The geometrical patterns correspond to patterns of metal, oxide, or semiconductor layers that make up the various components of the IC device 660 to be fabricated. The various layers combine to form various IC features. For example, a portion of the IC design layout 622 includes various IC features, such as an active region, gate structures, source/drain regions, interconnect structures, and openings for bonding pads, to be formed in a semiconductor substrate (such as a silicon wafer) and various material layers disposed on the semiconductor substrate. The design house 620 implements a proper design procedure to form the IC design layout 622. The design procedure includes one or more of logic design, physical design or place and route. The IC design layout 622 is presented in one or more data files having information of the geometrical patterns. For example, the IC design layout 622 can be expressed in a GDSII file format or DFII file format.

The mask house 630 includes mask data preparation 632 and mask fabrication 634. The mask house 630 uses the IC design layout 622 to manufacture one or more masks to be used for fabricating the various layers of the IC device 660 according to the IC design layout 622. The mask house 630 performs the mask data preparation 632, where the IC design layout 622 is translated into a representative data file ("RDF"). The mask data preparation 632 provides the RDF to the mask fabrication 634. The mask fabrication 634 includes a mask writer. A mask writer converts the RDF to an image on a substrate, such as a mask (reticle) or a semiconductor wafer. The design layout is manipulated by the mask data preparation 632 to comply with particular characteristics of the mask writer and/or requirements of the IC fab 640. In FIG. 27, the mask data preparation 632 and mask fabrication 634 are illustrated as separate elements. In some embodiments, the mask data preparation 632 and mask fabrication 634 can be collectively referred to as mask data preparation.

In some embodiments, the mask data preparation 632 includes optical proximity correction (OPC) which uses lithography enhancement techniques to compensate for image errors, such as those that can arise from diffraction, interference, other process effects and the like. OPC adjusts the IC design layout 622. In some embodiments, the mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 632 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during the mask fabrication 634, which may undo part of the modifications performed by OPC in order to meet mask creation rules.

In some embodiments, the mask data preparation 632 includes lithography process checking (LPC) that simulates processing that will be implemented by the IC fab 640 to fabricate the IC device 660. LPC simulates this processing based on the IC design layout 622 to create a simulated manufactured device, such as the IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the IC design layout 622.

It should be understood that the above description of the mask data preparation 632 has been simplified for the purposes of clarity. In some embodiments, the mask data preparation 632 includes additional features such as a logic operation (LOP) to modify the IC design layout according to manufacturing rules. Additionally, the processes applied to the IC design layout 622 during the mask data preparation 632 may be executed in a variety of different orders.

After the mask data preparation 632 and during mask fabrication 634, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by the mask fabrication 634 is used in a variety of processes. For example, such a mask(s) is used in an ion implantation process to form various doped regions in the semiconductor wafer, in an etching process to form various etching regions in the semiconductor wafer, and/or in other suitable processes.

The IC fab 640 is an IC fabrication entity that includes one or more manufacturing facilities for the fabrication of a variety of different IC products. In some embodiments, the IC fab 640 is a semiconductor foundry. For example, there may be a first manufacturing facility for the front end fabrication of a plurality of IC products (e.g., source/drain regions, gate structures), while a second manufacturing facility may provide the middle end fabrication for the interconnection of the IC products (e.g., contacts, vias, gate contacts, etc.) and a third manufacturing facility may provide the back end fabrication for the interconnection and packaging of the IC products (e.g., the frontside metallization layers, such as $M_0$, $M_1$, $M_2$, . . . , and $M_n$, the backside metallization layers, such as $BM_0$, $BM_1$, . . . and $BM_n$, etc., the vias, such as $V_0$, $V_1$, $V_2$, . . . and $V_{n-1}$, and the vias, such as $BV_0$, $BV_1$, . . . and $BV_{n-1}$, etc.), and a fourth manufacturing facility may provide other services for the foundry entity.

The IC fab 640 uses the mask (or masks) fabricated by the mask house 630 to fabricate the IC device 660. Thus, the IC fab 640 at least indirectly uses the IC design layout 622 to fabricate the IC device 660. In some embodiments, a semiconductor wafer 642 is fabricated by the IC fab 640 using the mask (or masks) to form the IC device 660. The semiconductor wafer 642 includes a silicon substrate or other proper substrate having material layers formed thereon. Semiconductor wafer further includes one or more of various doped regions, dielectric features, multilevel interconnects, and the like (formed at subsequent manufacturing steps).

The IC manufacturing system 600 is shown as having the design house 620, mask house 630, and IC fab 640 as separate components or entities. However, it should be understood that one or more of the design house 620, mask house 630, and IC fab 640 are part of the same component or entity.

FIG. 28 is a flowchart illustrating an example method 700 for fabricating a semiconductor device that includes the disclosed eFuse memory cell (e.g., the eFuse memory cells 201A-201F and 301) and the backside power rails (e.g., backside interconnect structures 250 for providing the supply voltage $V_{SS}$ coupled to the eFuse memory cell, according to various aspects of the present disclosure. The method 700 may be part of the operation 420 of the method 400 (FIG. 25). As such, the semiconductor device may be made based on at least a portion of the layout design disclosed herein.

At least some operations of the method 700 can be used to form a semiconductor device in a non-planar transistor configuration. For example, the semiconductor device may include one or more FinFETs or GAA FETs. However, it should be understood that the transistors of the semiconductor device may be each configured in any of various other types of transistors such as, for example, a complementary FET (CFET), while remaining within the scope of the present disclosure. It should be noted that the method 700 is merely an example and is not intended to limit the present disclosure. Accordingly, it should be understood that additional operations may be provided before, during, and/or after the method 700, and that some other operations may only be briefly described herein. The following discussions of the method 700 may refer to one or more components of FIGS. 1-24.

In brief overview, the method 700 starts with operation 702 of providing a semiconductor substrate having a first portion and a second portion adjacent to the first portion. The method 700 proceeds to operation 704 of forming first sub-transistors in the first portion and second sub-transistors in the second portion on the frontside. The method 700 proceeds to operation 706 of forming first interconnect structures in the first portion and the second portion on the frontside, the first interconnect structures including a fuse resistor electrically coupled to the first sub-transistors. The method 700 proceeds to operation 708 of forming a plurality of first via structures on a backside of the semiconductor substrate, the first via structures coupled to at least portions of each of the first sub-transistors and the second sub-transistors. The method 700 proceeds to operation 710 of forming a second via structure on the backside of the semiconductor substrate coupled to the first interconnect structures and adjacent to the second sub-transistors in the second portion. The method 700 proceeds to operation 712 of forming second interconnect structures coupled to the first via structures and the second via structure on the backside.

In various embodiments, the first sub-transistors and the second sub-transistors (e.g., the sub-transistors t1 and the sub-transistors t2, respectively) and the first interconnect structures (e.g., the frontside interconnect structures 300) on the frontside (e.g., the frontside 202A) of the semiconductor substrate (e.g., the substrate 202) form a number of the disclosed eFuse memory cells (e.g., the eFuse memory cells 201A-201G), and the second interconnect structures (e.g., the backside interconnect structures 250) on the backside (e.g., the backside 202B) of the semiconductor substrate include power rails configured to provide a supply voltage ($V_{SS}$) to the eFuse memory cells and coupled to the eFuse memory cells on the frontside by a plurality of via structures (e.g., the backside vias 240 and 244 and/or the feedthrough vias 280 and 286).

Corresponding to operation 702, the semiconductor substrate (e.g., the substrate 202) may include a bulk semiconductor, a semiconductor-on-insulator (SOI) substrate, or the like, which may be doped (e.g., with a p-type or an n-type dopant) or undoped. The semiconductor substrate may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor substrate includes the first portion (e.g., the first region P1) and the second portion (e.g., the second region P2).

Corresponding to operation 704, on the frontside (e.g., the frontside 202A) of the semiconductor substrate (e.g., in the first region P1 and the second region P2), a number of first sub-transistors (e.g., the sub-transistors t1) and second sub-transistors (e.g., the sub-transistors t2) are formed along a first direction (e.g., the first lateral direction or the X axis). Using a FinFET as an example embodiment of the transistor, the transistor may be formed by at least some of the following process steps: forming a fin structure (e.g., the active region 204 or 206) protruding from the semiconductor substrate; forming a dummy gate structure (not depicted herein) straddling a channel region of the fin structure; forming gate spacers (not depicted herein) disposed along opposite sidewalls of the dummy gate structure; forming source/drain regions (e.g., the source/drain regions 216/218 and 226/228) in the fin structure that are disposed on opposite sides of the dummy gate structure; removing the dummy gate structure; and forming an active (e.g., metal) gate structure (e.g., the gate structure 220 or 224) in place of the dummy gate structure.

Corresponding to operation 706, on the frontside of the semiconductor substrate, the first interconnect structures (e.g., the frontside interconnect structures 300) are formed over the first sub-transistors and the second sub-transistors.

The first interconnect structures can include a number of middle-end-of-line (MEOL) interconnect structures (e.g., the source/drain contacts 230 and 234, contact features 236 and 238; the vias 260; the gate contacts 262, etc.), and a number of back-end-of-line (BEOL) interconnect structures (e.g., the frontside metallization layers, such as $M_0$, $M_1$, $M_2$, . . ., and $M_n$, and the vias, such as $V_0$, $V_1$, $V_2$, . . . and $V_{n-1}$, etc.), as described above. In the present embodiments, the frontside interconnect structures include a fuse resistor (e.g., the fuse resistor 356) electrically coupled to the first sub-transistors (e.g., the sub-transistors t1) to form an eFuse memory cell (e.g., the eFuse memory cells 201A-201G). In some embodiments, the MEOL and BEOL interconnect structures can each extend along a single direction. For example, the source/drain contacts 230 and 234 and the contact features 236 and 238 may all extend along the second lateral direction in parallel with the gate structures 220, 222, and 224.

The first interconnect structures may be formed by at least some of the following steps: forming a dielectric layer over the transistors on the frontside; patterning the dielectric layer to form opening corresponding to positions of various components of the first interconnect structures; and forming conductive (e.g., metal) structures in the openings, resulting in the first interconnect structures. Each of the first interconnect structures disposed on the frontside can include one or more metal materials such as, for example, tungsten (W), copper (Cu), gold (Au), cobalt (Co), ruthenium (Ru), or combinations thereof, disposed in a dielectric material (e.g., an ILD layer, an IMD layer, etc.; not depicted herein).

Corresponding to operations 708 and 710 collectively, on the backside (e.g., the backside 202B) of the semiconductor substrate, a plurality of via structures, including the first via structures (e.g., the backside vias 240 and 244) and the second via structure (e.g., the feedthrough via 280), are formed in connection with portions of components formed on the frontside of the semiconductor substrate. At operation 708, the first via structures are coupled to at least portions of each of the first sub-transistors (e.g., the sub-transistors t1) and the second sub-transistors (e.g., the sub-transistor t2). At operation 710, the second via structure is formed in the second portion (e.g., the second region P2) and extends along the first lateral direction (e.g., the X axis). The second via structure is formed adjacent to the second sub-transistors (e.g., the sub-transistors t2) along a second lateral direction (e.g., the Y axis). A third via structure (e.g., the feedthrough via 286) may be formed adjacent to the first sub-transistors (e.g., the sub-transistors t1) along the second lateral direction (e.g., the Y axis) in the first portion (e.g., the first region P1). The third via structure extends along the first lateral direction and is coupled to the second interconnect structures (e.g., the backside interconnect structures 250).

The first, second, and third via structures may be formed by at least some of the following processing steps: flipping the semiconductor substrate; optionally thinning down the semiconductor substrate from the backside until bottom surfaces of the source/drain regions (e.g., source/drain regions 216/218 and 226/228) are exposed; forming a dielectric layer over the backside; patterning the dielectric layer to form openings corresponding to positions of the backside vias and the feedthrough vias; and forming conductive (e.g., metal) structures in the openings, resulting in the via structures on the backside. The resulting backside vias (e.g., the backside vias 240 and 244) are each coupled to one of the source/drain regions of each transistor and the resulting feedthrough vias (e.g., the feedthrough vias 280 and 286) are each coupled to a contact feature (e.g., the contact feature 236). Each of the feedthrough vias has a larger cross-sectional area, and thus lower resistance, than the backside via.

Corresponding to operation 712, on the backside of the semiconductor substrate, the second interconnect structures (e.g., the backside interconnect structures 250) are formed. The second interconnect structures extend along the first direction and are coupled to the first via structures (e.g., the backside vias 240 and 244) and the second via structures (e.g., the feedthrough vias 280 and 286). In the present embodiments, the second interconnect structures function as power rails for providing a supply voltage to the eFuse memory cells from the backside. The second interconnect structures are formed in a manner similar to that of forming the first interconnect structures and in connection with each of the via structures formed at operations 708 and 710. Each of the second interconnect structures disposed on the backside can include one or more metal materials such as, for example, tungsten (W), copper (Cu), gold (Au), cobalt (Co), Ruthenium (Ru), or combinations thereof.

In one aspect of the present disclosure, a memory device is disclosed. The memory device includes a substrate having a first side opposite to a second side. The memory device includes a memory cell having a transistor and a resistor operatively coupled to each other in series, where the memory cell is disposed on the first side, and the transistor further includes a plurality of first sub-transistors disposed in a first region of the substate. The memory device includes a plurality of second sub-transistors disposed in a second region of the substrate. The memory device further includes a first interconnect structure disposed on the second side. The first sub-transistors are each coupled to the first interconnect structure through a plurality of first via structures. The second sub-transistors are each coupled to the first interconnect structure through a plurality of second via structures and at least a third via structure, where the first via structures and the second via structures each have a first cross-sectional area, and the third via structure has a second cross-sectional area that is different from the first cross-sectional area.

In another aspect of the present disclosure, a memory device is disclosed. The memory device includes a substrate including a first area and a second area each extending lengthwise along a first direction and widthwise along a second direction that is perpendicular to the first direction. The memory device includes a first active region formed in the first area and on a frontside of the substrate, where the first active region extends lengthwise along a first direction. The memory device includes a first interconnect structure formed on the frontside and coupled to one or more first portions of the first active region. The memory device includes a second interconnect structure formed on a backside of the substrate opposite to the frontside. The memory device includes a plurality of first via structures coupling one or more second portions of the first active region to the second interconnect structure. The memory device includes a second active region formed in the second area and on the first side of the substrate, where the second active region extends lengthwise along the first direction. The memory device includes a plurality of second via structures coupling one or more portions of the second active region to the second interconnect structure. The memory device further includes at least one third via structure coupling the first interconnect structure to the second interconnect structure in the second area. The first via structures and the second via structures each extend a first length along the first direction.

The third via structure extends a second length along the first direction that is longer than the first length.

In yet another aspect of the present disclosure, a method for fabricating a memory device is disclosed. The method includes providing a substrate having a first portion and a second portion adjacent to the first portion. The method includes forming, on a frontside of the substrate and along a first direction, first sub-transistors in the first portion and second sub-transistors in the second portion. The method includes forming, on the frontside of the substrate, first interconnect structures in the first portion and the second portion, where the first interconnect structures include a resistor electrically coupled to the first sub-transistors. The method includes forming, on a backside of the substrate opposite to the frontside, first via structures electrically coupled to a source/drain region of each of the first sub-transistors and the second sub-transistors. The method includes forming, on the backside of the substrate, second via structures extending along a first direction in the second portion, where the second via structures are electrically coupled to the first interconnect structures and formed adjacent to the second sub-transistors along a second direction perpendicular to the first direction. The method includes forming, on the backside of the substrate, second interconnect structures extending along the first direction and electrically coupled to the first via structures and the second via structures. The second interconnect structures includes a power rail configured to provide a supply voltage to the first sub-transistors.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a substrate having a first side opposite to a second side;

a memory cell including a transistor and a resistor coupled to each other in series, the memory cell disposed on the first side, the transistor further comprising a plurality of first sub-transistors disposed in a first region of the substrate;

a plurality of second sub-transistors disposed in a second region of the substrate;

a first interconnect structure disposed on the second side; and a dummy region interposed between the first region and the second region, wherein:

the first sub-transistors are each coupled to the first interconnect structure through a plurality of first via structures, and the second sub-transistors are each coupled to the first interconnect structure through a plurality of second via structures and at least a third via structure, the first via structures and the second via structures each having a first cross-sectional area, and the third via structure having a second cross-sectional area that is different from the first cross-sectional area.

2. The memory device of claim 1, wherein the first interconnect structure is configured to provide a supply voltage for the memory cell.

3. The memory device of claim 1, wherein a conduction path is formed by applying a programming voltage on a first end of the resistor and applying a supply voltage on the first interconnect structure.

4. The memory device of claim 3, wherein the conduction path extends from the first end of the resistor, through at least the resistor, a second end of the resistor, the first sub-transistors, and the second sub-transistors, and to the first interconnect structure.

5. The memory device of claim 1, further comprising a second interconnect structure disposed on the first side, wherein the second interconnect structure includes a first portion coupled to the third via structure and a second portion coupled to the second sub-transistors.

6. The memory device of claim 5, wherein the resistor is disposed in a third portion of the second interconnect structure.

7. The memory device of claim 1, wherein the first cross-sectional area is less than the second cross-sectional area.

8. The memory device of claim 1, wherein at least a portion of the second region extends adjacent to the first region.

9. The memory device of claim 1, wherein the dummy region includes a via structure.

10. A memory device, comprising:
a substrate including a first area and a second area, the first area and the second area each extending lengthwise along a first direction and widthwise along a second direction that is perpendicular to the first direction;
a first active region formed in the first area and on a frontside of the substrate, the first active region extending lengthwise along the first direction;
a first interconnect structure formed on the frontside and coupled to one or more first portions of the first active region;
a second interconnect structure formed on a backside of the substrate opposite to the frontside;
a plurality of first via structures coupling one or more second portions of the first active region to the second interconnect structure;
a second active region formed in the second area and on the first side of the substrate, the second active region extending lengthwise along the first direction;
a plurality of second via structures coupling one or more portions of the second active region to the second interconnect structure; and
at least one third via structure coupling the first interconnect structure to the second interconnect structure in the second area, wherein:
the first via structures and the second via structures each extend a first length along the first direction, and
the third via structure extends a second length along the first direction, the second length being longer than the first length.

11. The memory device of claim 10, wherein the third via structure and the second active region are spaced along the second direction in a top view.

12. The memory device of claim 10, wherein the first area extends a first height along the second direction and the second area extends a second height along the second direction, the second height being the same as the first height.

13. The memory device of claim 10, wherein the first area extends a first height along the second direction and the second area extends a second height along the second direction, the second height being different from the first height.

14. The memory device of claim 10, wherein the first active region extends a first height along the second direction and the second active region extends a second height along the second direction, the second height being less than the first height.

15. The memory device of claim 10, wherein the first active region extends a first height along the second direction and the second active region extends a second height along the second direction, the second height being the same as the first height.

16. The memory device of claim 10, further comprising at least one fourth via structure coupling the first interconnect structure to the second interconnect structure in the first area, wherein the third via structure extends lengthwise along the first direction.

17. The memory device of claim 10, wherein the first active region provides at least one transistor coupled to a fuse resistor disposed in the first interconnect structure.

18. The memory device of claim 10, wherein the second active region provides a plurality of transistors collectively coupled to the one or more second portions of the first active region.

19. A method for fabricating a memory device, comprising:
providing a substrate having a first portion and a second portion adjacent to the first portion;
forming, on a frontside of the substrate, first sub-transistors in the first portion and second sub-transistors in the second portion, wherein adjacent first sub-transistors and second sub-transistors are respectively arranged along a first direction;
forming, on the frontside of the substrate, first interconnect structures in the first portion and the second portion, wherein the first interconnect structures include a fuse resistor electrically coupled to the first sub-transistors;
forming, on a backside of the substrate opposite to the frontside, first via structures coupled to at least portions of each of the first sub-transistors and the second sub-transistors;
forming, on the backside of the substrate, a second via structure extending along the first direction in the second portion, wherein the second via structure is coupled to the first interconnect structures and formed adjacent to the second sub-transistors along a second direction perpendicular to the first direction; and
forming, on the backside of the substrate, second interconnect structures extending along the first direction and coupled to the first via structures and the second via structure, the second interconnect structures including a power rail configured to provide a supply voltage to the first sub-transistors.

20. The method of claim 19, wherein forming the second via structure includes forming a third via structure extending along the first direction in the first portion, and wherein the third via structure is coupled to the second interconnect structures and formed adjacent to the first sub-transistors along the second direction.

* * * * *